US011982942B2

(12) United States Patent
Koppe et al.

(10) Patent No.: US 11,982,942 B2
(45) Date of Patent: May 14, 2024

(54) POSITIVE TONE PHOTORESIST FORMULATION USING CROSSLINKABLE SILOXANE COMPOUNDS

(71) Applicant: MERCK PATENT GMBH, Darmstadt (DE)

(72) Inventors: Karsten Koppe, Darmstadt (DE); Naofumi Yoshida, Kanagawa (JP)

(73) Assignee: MERCK PATENT GMBH, Darmstadt (DE)

( * ) Notice: Subject to any disclaimer, the term of this patent is extended or adjusted under 35 U.S.C. 154(b) by 0 days.

(21) Appl. No.: 17/767,698

(22) PCT Filed: Oct. 9, 2020

(86) PCT No.: PCT/EP2020/078487
§ 371 (c)(1),
(2) Date: Apr. 8, 2022

(87) PCT Pub. No.: WO2021/069708
PCT Pub. Date: Apr. 15, 2021

(65) Prior Publication Data
US 2024/0053681 A1 Feb. 15, 2024

(30) Foreign Application Priority Data
Oct. 10, 2019 (EP) .................................... 19202547

(51) Int. Cl.
*G03F 7/075* (2006.01)
*C08G 77/00* (2006.01)
*C08G 77/04* (2006.01)

(52) U.S. Cl.
CPC ........... *G03F 7/0757* (2013.01); *C08G 77/04* (2013.01); *C08G 77/70* (2013.01); *C08G 77/80* (2013.01)

(58) Field of Classification Search
CPC ....... G03F 7/0757; C08G 77/04; C08G 77/70; C08G 77/80
(Continued)

(56) References Cited

U.S. PATENT DOCUMENTS

| 4,019,904 A | 4/1977 | Noshiro et al. |
| 10,409,161 B2 | 9/2019 | Misumi et al. |

(Continued)

FOREIGN PATENT DOCUMENTS

| CN | 104447849 A | 3/2015 |
| JP | 2008185672 A | 8/2008 |

(Continued)

OTHER PUBLICATIONS

International Search Report for PCT/EP2020/078487 dated Jan. 25, 2021.

(Continued)

*Primary Examiner* — Caleen O Sullivan
(74) *Attorney, Agent, or Firm* — Millen, White, Zelano & Branigan, P.C.; Brion P. Heaney

(57) ABSTRACT

The present invention relates to novel positive tone photoresist formulations comprising using crosslinkable siloxane polymers. The siloxane polymers used in the positive tone photoresist formulations are crosslinkable and comprise a first repeating unit, which contains at least one maleimide group, and a second repeating unit, which does not contain a maleimide group. The present invention further provides a manufacturing method for a microelectronic structure using a positive tone photoresist formulation according to the present invention and to an electronic device comprising a microelectronic structure, which is obtained or obtainable by said manufacturing method.

22 Claims, 1 Drawing Sheet

I II III IV V

(58) Field of Classification Search
USPC .................. 430/270.1, 311, 272.1, 271.1
See application file for complete search history.

(56) References Cited

U.S. PATENT DOCUMENTS

| | | |
|---|---|---|
| 2006/0009578 A1 | 1/2006 | Dershem |
| 2007/0205399 A1 | 9/2007 | Mizori |
| 2011/0319582 A1 | 12/2011 | Inata et al. |
| 2012/0056249 A1 | 3/2012 | Mueller et al. |
| 2013/0099228 A1 | 4/2013 | Ahn et al. |
| 2014/0335452 A1 | 11/2014 | Yokoyama et al. |
| 2019/0112400 A1 | 4/2019 | Sattler et al. |
| 2020/0225583 A1 | 7/2020 | Yoshida et al. |

FOREIGN PATENT DOCUMENTS

| | | |
|---|---|---|
| JP | 2015046332 A | 3/2015 |
| TW | 201915041 A | 4/2019 |
| WO | 2017144148 A1 | 8/2017 |
| WO | 2019063460 A1 | 4/2019 |

OTHER PUBLICATIONS

English Abstract for JP2008185672, Publication Date: Aug. 14, 2008.
Search report in corresponding ROC (Taiwan) Patent Application No. 109134900 dated Dec. 12, 2023 (pp. 1-5) with English translation thereof (pp. 1-3).

I  II  III  IV  V

POSITIVE TONE PHOTORESIST FORMULATION USING CROSSLINKABLE SILOXANE COMPOUNDS

TECHNICAL FIELD OF THE INVENTION

The present invention relates to novel positive tone photoresist formulations comprising using crosslinkable siloxane polymers. The siloxane polymers used in the positive tone photoresist formulations are crosslinkable and comprise a first repeating unit, which contains at least one maleimide group, and a second repeating unit, which does not contain a maleimide group.

The positive tone photoresist formulations are photopatternable and particularly suitable for the preparation of dielectric materials having excellent barrier, passivation and/or planarization properties. Said photoresist formulations may be used for various applications in electronics industry, where insulating, protective or barrier materials in the form of layers, films or coatings are required, such as, for example, in electronic packaging or in the preparation of field effect transistors (FETs) or thin film transistors (TFTs) for electronic devices. The dielectric material may form barrier coatings, passivation layers, planarization layers or combined passivation and planarization layers on conducting or semiconducting structures such as e.g. in FETs or TFTs. Moreover, the materials may be used for preparing substrates for printed circuit boards. The photoresist formulations can be cured under thermal conditions at low temperature or by application of UV radiation only.

The cured dielectric material, which is obtained from the positive tone photoresist formulation, shows excellent film forming capability, excellent thermal properties, excellent mechanical properties as well as an easy handling and processing from conventional solvents. In addition, the obtained material is characterized by a low dielectric constant and a low coefficient of thermal expansion (CTE). Due to a favorable and well-balanced relationship between stiffness and elasticity of the material, thermal stress, which may occur during operation of an electronic device can be easily compensated.

The present invention further provides a manufacturing method for a microelectronic structure using a positive tone photoresist formulation according to the present invention and to an electronic device comprising a microelectronic structure, which is obtained or obtainable by said manufacturing method.

BACKGROUND OF THE INVENTION

Various materials have been described for the preparation of dielectric materials in electronics industry so far. For example, US 2012/0056249 A1 relates to polycycloolefins, which are based on norbornene-type polymers and, which are used for the preparation of dielectric interlayers applied to fluoropolymer layers in electronic devices.

WO 2017/144148 A1 provides a positive type photosensitive siloxane composition capable of forming cured films, such as a planarization film for a TFT substrate or an interlayer insulating film. The positive type photosensitive siloxane composition comprises (I) a polysiloxane having a substituted or unsubstituted phenyl group, (II) a diazonaphthoquinone derivative, (Ill) a hydrate or solvate of a photo base-generator, and (IV) a solvent.

US 2013/0099228 A1 relates to a passivation layer solution composition containing an organic siloxane resin represented by

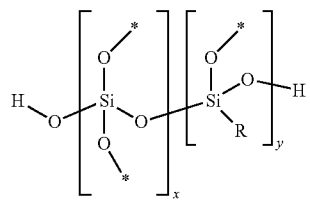

wherein R is at least one substituent elected from a saturated hydrocarbon or an unsaturated hydrocarbon having from 1 to about 25 carbon atoms, and x and y may each independently be from 1 to about 200, and wherein each asterisk indicates a bond to an H atom or to an x siloxane unit or a y siloxane unit, or a bond to an x siloxane unit or a y siloxane unit of another siloxane chain comprising x siloxane units or y siloxane units or a combination thereof. The passivation layer solution composition is used for preparing passivation layers on oxide semiconductors in thin film transistor (TFT) array panels.

The passivation layer in an oxide semiconductor should be one that suppresses penetration of moisture, hydrogen and oxygen or the like. Infiltration of these impurities significantly changes the conductivity of the oxide semiconductor and inhibits the operation stability to invite threshold fluctuation, etc.. Passivation layers suitable for TFT application, such as $SiO_x$, $SiON_x$, $SiN_x$ or the like are mainly utilized by means of chemical vapor deposition (CVD) or physical vapor deposition (PVD). These vapor deposition techniques have the problem to be harmful for the oxide semiconductor layer. Moreover, in the production of the oxide semiconductor device, it is concerned that the oxide semiconductor is further deteriorated by various chemicals or by processes such as dry etching. Therefore, as protection from the process, a protective film such as an etch stopper may be applied. Therefore, in order to overcome these drawback liquid protective films coated onto the substrates by wet coating methods have been proposed (JP 2015/146332 A).

Furthermore, US 2007/0205399 A1 relates o functionalized cyclic siloxanes, which are useful as thermosetting adhesive resins for the electronic packaging industry, and US 2011/0319582 A1 relates to curable compositions comprising a reaction product obtained by reacting an alkoxysilane compound and inorganic oxide microparticles in the presence of water and an organic solvent.

As it is apparent from the above, organopolysiloxanes are a very interesting class of compounds due to their thermal stability and mechanical hardness and they are used for a variety of different applications such as e.g. for the formation of cured films having high heat resistance, transparency and resolution. Organopolysiloxanes with methyl and/or phenyl side groups are used as dielectric materials in the electronic industry (mainly front-end of line (FEOL)), where thermally stable materials are needed. These materials have to withstand temperatures up to 600° C. However, the known materials are too rigid and brittle for the use in back-end of line (BEOL) applications, namely as redistribution, stress buffer, or passivation layers, where temperature requirements are somewhat smaller (250-300° C.), but mechanical properties are becoming much more important, such as elongation and thermal expansion.

Flexible material systems are required to prevent device cracking or delamination of coatings. Usually, such material systems are modified and adapted to specific application requirements by complex blending concepts of currently more than ten different compounds in order to adjust the desired mechanical, thermal and/or electrical properties. Advantageously, organopolysiloxane-type polymers are tailorable to overcome possible drawbacks such as poor adhesion, poor elongation or high thermal expansion/shrinkage and may prevent complex multi-component solutions.

Hence, there is a continuous need for the development of new compounds, which may be used as dielectric materials or barrier coating materials for various applications in electronics industry, such as e.g. for packaging of microelectronic devices or for preparing field effect transistors (FETs) or thin film transistors (TFTs).

OBJECT OF THE INVENTION

The present invention is achieved in consideration of the above background and aims to provide a positive tone photosensitive photoresist formulation, which does not emit harmful volatile substances, such as e.g. benzene, and which can form patterns of dielectric material with high resolution, high heat resistance, low dielectric constant, good adhesion to multiple surfaces, high flexibility with a low coefficient of thermal expansion to prevent warpage and delamination of the substrate upon heating and cooling.

In fabrication processes of photopatterned passivation layers, the deposited layer of the dielectric material precursor has to go through different process steps as shown in FIG. 1. A problem which occurs here is that multiple additives need to be used to arrive at a formulation which permits sufficient and satisfactory patterning. The formulation needs to fulfil certain criteria, such as being applicable by spin coating, being suitable for forming uniform coatings on the wafer, showing photosensitivity towards UV light, being developable with aqueous solutions, e.g. TMAH/$H_2O$ and allowing the formation of stable patterns at temperatures of up to 230° C. without cracking.

It was found that standard siloxane coatings do not fulfil the above criteria. Therefore, additives need to be blended into the photoresist composition to increase its performance or even to make it work as required. Moreover, standard siloxane photoresist formulations show a dramatic flow upon heating in the post-baking step resulting in bad or even no pattern on the substrate. As a consequence, additives such as photoacid generators (PAGs) are added to overcome this deficiency. Some of the materials obtained from photoresist formulations known in the state of the art are very brittle and therefore have a very low cracking threshold making it difficult to cast uniform films with thicknesses of above ~2 µm which resist temperatures above 200° C.

Another issue is the solubility of additives in common solvents and polysiloxanes. Some additives, such as e.g. PAGs or photoactive compounds, need to be completely dissolved to prevent inhomogeneity or particle formation in the film. All these issues should be reduced to a minimum to realize a suitable performance of the electronic device. Currently, known photoresist formulations consist of up to 20 different ingredients to fulfil all the requirements. However, such complex mixture may adversely influence the performance of the electronic device so that further optimization of good performing formulations is very challenging. The use of additives additionally increases the costs of the formulation and complicates reproducibility.

Hence, it is an object of the present invention to overcome the drawbacks in the prior art and to provide a new positive tone photoresist formulation, which allows the preparation of dielectric materials with excellent barrier, passivation and/or planarization properties, which can be used for various applications in electronics industry. Preferred applications are, e.g. electronic packaging or the preparation of FET or TFT devices. The dielectric material may be used for structuring redistribution layers (RDLs) in packaged microelectronic devices or for the formation of barrier coatings, passivation layers, planarization layers or combined passivation and planarization layers on conducting or semiconducting structures.

Moreover, it is an object to provide new positive tone photoresist formulations for the preparation of dielectric materials, which show excellent film forming capabilities, excellent photosensitivity and photopatternability, excellent thermal properties, such as e.g. a low coefficient of thermal expansion, and excellent mechanical properties, such as e.g. excellent flexibility and adhesion, when used for the formation of passivation layers in packaged electronic devices. It is a further object to provide new photoresist formulations, which can be produced at low cost and which allow an easy handling and processing from conventional solvents.

Beyond that, it is an object of the present invention to provide a manufacturing method for a microelectronic structure using said positive tone photoresist formulation and to provide an electronic device comprising said microelectronic structure.

SUMMARY OF THE INVENTION

The present inventors have surprisingly found that the above objects are achieved by a positive tone photoresist formulation, which comprises:
(a) a siloxane polymer comprising a first repeating unit and a second repeating unit; and
(b) a photoactive dissolution modulator;
wherein the first repeating unit contains at least one maleimide group; and the second repeating unit does not contain a maleimide group.

The positive tone photoresist formulation according to the present invention shows excellent performance, even without the addition of photoacid generators (PAGs), and allows a cost-effective and reliable manufacturing of microelectronic devices.

There is further provided a method for manufacturing a microelectronic structure, comprising the following steps:
(1) applying a positive tone photoresist formulation according to the present invention to a surface of a substrate;
(2) photopatterning of the positive tone photoresist formulation applied in step (1) to obtain a photopatterned structure; and
(3) curing the photopatterned structure obtained in step (2) to obtain a cured photopatterned dielectric material on the surface of the substrate.

Finally, there is provided an electronic device, comprising a microelectronic structure, obtainable or obtained by the method for manufacturing according to the present invention.

Preferred embodiments of the present invention are described hereinafter and in the dependent claims.

DETAILED DESCRIPTION

Electronic Packaging

Figure 1:
FIG. 1: Fabrication process for the preparation of photopatterned passivation layers. Step (I): polysiloxane coating, spin/slit coating, pre-baking for 90 s at 100° C.; step (II): exposure, photopatterning, UV light (g, h, i-line), 50 to 300 mJ/cm$^2$; step (III) development, 2.38% TMAH/water, rinse deionized water; step (IV) flood exposure, UV light (g, h, i-line), 200 to 600 mJ/cm$^2$, for bleaching; and step (V) post-baking, thermal 90 min at 230° C.

As solid-state transistors started to replace vacuum-tube technology, it became possible for electronic components, such as resistors, capacitors, and diodes, to be mounted directly by their leads into printed circuit boards of cards, thus establishing a fundamental building block or level of packaging that is still in use. Complex electronic functions often require more individual components than can be interconnected on a single printed circuit card. Multilayer card capability was accompanied by development of three-dimensional packaging of daughter cards onto multilayer mother boards. Integrated circuitry allows many of the discrete circuit elements such as resistors and diodes to be embedded into individual, relatively small components known as integrated circuit chips or dies. In spite of incredible circuit integration, however, more than one packaging level is typically required, in part because of the technology of integrated circuits itself. Integrated circuit chips are quite fragile, with extremely small terminals. First-level packaging achieves the major functions of mechanically protecting, cooling, and providing capability for electrical connections to the delicate integrated circuit. At least one additional packaging level, such as a printed circuit card, is utilized, as some components (high-power resistors, mechanical switches, capacitors) are not readily integrated onto a chip. For very complex applications, such as mainframe computers, a hierarchy of multiple packaging levels is required.

As a consequence of Moore's law, advanced electronic packaging strategies are playing an increasingly important role in the development of more powerful electronic products. In other words, as the demand for smaller, faster, and more functional mobile and portable electronic devices increases, the demand for improved cost-effective packaging technologies is also increasing. A wide variety of advanced packaging technologies exist to meet the requirements of today's semiconductor industry. The leading Advanced Packaging technologies—wafer-level packaging (WLP), fan-out wafer level packaging (FOWLP), 2.5D interposers, chip-on-chip stacking, package-on-package stacking, embedded IC—all require structuring of thin substrates, redistribution layers and other components like high resolution interconnects.

The end consumer market presents constant push for lower prices and higher functionality on ever smaller and thinner devices. This drives the need for the next generation packaging with finer features and improved reliability at a competitive manufacturing cost.

Wafer-level packaging (WLP) is the technology of packaging an integrated circuit while still part of the wafer, in contrast to the more conventional chip scale packaging method, where the wafer is sliced into individual circuits (dices) and then packaged. WLP offers several major advantages compared to chip scale package technologies and it is essentially a true chip-scale package (CSP) technology, since the resulting package is practically of the same size as the die. Wafer-level packaging allows integration of wafer fab, packaging, test, and burn-in at wafer level in order to streamline the manufacturing process undergone by a device from silicon start to customer shipment. Major application areas of WLP are smartphones and wearables due to their size constraints. Functions provided WLPs in smartphones or wearables include: compass, sensors, power management, wireless etc. Wafer-level chip scale packaging (WL-CSP) is one of the smallest packages currently available on the market. WLP can be categorized into fan-in and fan-out WLP. Both of them use a redistribution technology to form the connections between chips and solder balls.

Fan-out wafer level packaging (FOWLP) is one of the latest packaging trends in microelectronics: FOWLP has a high miniaturization potential both in the package volume as well as in the packaging thickness. Technological basis of FOWLP is a reconfigured, painted wafer with embedded chips and a thin film rewiring layer, which together form a surface-mounted device (SMD)-compatible package. The main advantages of the FOWLP are a very thin, because substrateless package, the low thermal resistance, good high-frequency properties due to short and planar electrical connections together with a bumpless chip connection instead of e.g. wire bonds or solder contacts.

With current materials, WLP processes are limited to medium chip size applications. The reasons for this restriction are mainly due to the current material selection, which shows a thermal mismatch with the silicon die and therefore can reduce the performance and generate stress on the dies. New materials with better mechanical properties (in particular, a coefficient of thermal expansion (CTE) closer to the CTE of silicon) are in high demand. Currently, redistribution layers (RDLs) are made from copper layers, which are electroplated on polymer passivation layers such as polyimides (PI), butylcyclobutanes (BCB), or polybenzoxazoles (PBO). Low curing temperatures in addition to photopatternability are two further important requirements for such materials.

Thin Film Transistors (TFTs)

Thin film transistor (TFT) array panel are typically used as circuit boards for independently driving pixels in liquid crystal, electrophoretic particle/liquid, organic electro-luminescent (EL) display devices, quantum dot electro-luminescent and light emitting diodes. A TFT array panel includes a scanning line or a gate line transmitting a scanning signal, an image signal line or a data line transmitting an image signal, a thin film transistor connected to the gate line and the data line, and a pixel electrode connected to the thin film transistor. A TFT includes a gate electrode that is a portion of the gate wire, a semiconductor layer forming a channel, a source electrode that is a portion of the data wire, and a drain electrode. For oxide based TFTs, the oxide semiconductor layer may be composed of indium oxide, zinc oxide and gallium oxide, but it may be also composed of some other oxide as long as it exhibits semiconductor characteristics. The TFT is a switching element controlling an image signal transmitted to the pixel electrode through the data wire according to the scanning signal transmitted through the gate line.

For the deposition of silicon nitride/silicon oxide layers onto a silicon or oxide semiconductor substrate, two methods are currently in use:

Low pressure chemical vapor deposition (LPCVD) technology, which works at rather high temperature and is performed either in a vertical or in a horizontal tube furnace; or Plasma-enhanced chemical vapor deposition (PECVD) technology, which works at rather low temperature and under vacuum conditions.

It is experienced that $SiN_x$ films made by LPCVD with thicknesses of 200 nm and larger tend to crack easily under pressure or temperature change. The process temperature is too high to apply for glass substrate and hydrogenated amorphous silicon or oxide semiconductors. $SiN_x$ films made by PECVD have less tensile stress, but, which still causes glass substrate curling with elevated glass substrate size. Also it has worse electrical properties. The plasma can also damage thin film semiconductor, especially oxide semiconductors to degrade TFT performance.

Photostructuring of SiN layers requires many steps including photoresist coating, photo patterning, $SiN_x$ etching, photoresist stripping, cleaning, etc. These procedures are time and cost consuming. Hence, new types of materials are required for passivating semiconductor layers in TFTs forming part of TFT array panels.

Definitions

The term "polymer" includes, but is not limited to, homopolymers, copolymers, for example, block, random, and alternating copolymers, terpolymers, quaterpolymers, etc., and blends and modifications thereof. Furthermore, unless otherwise specifically limited, the term "polymer" shall include all possible configurational isomers of the material. These configurations include, but are not limited to isotactic, syndiotactic, and atactic symmetries. A polymer is a molecule of higher relative molecular mass, which essentially comprises the multiple repetition of units (i.e. repeating units) derived, actually or conceptually, from molecules of low relative mass (i.e. monomers). In the context of the present invention, the term "polymer" shall also include dimers, trimers, tetramers and oligomers of one or more types of polymers.

It is preferred that polymers in the context of the present invention are composed of at least 2, more preferably at least 5, even more preferably at least 10, still more preferably at least 30 and most preferably at least 60 monomers.

The term "monomer" as used herein, refers to a polymerizable compound, which can undergo polymerization thereby contributing constitutional units (repeating units) to the essential structure of a polymer or an oligomer. Polymerizable compounds are functionalized compounds having one or more polymerizable groups. Large numbers of monomers combine in polymerization reactions to form polymers. Monomers with one polymerizable group are also referred to as "monofunctional" or "monoreactive" compounds, compounds with two polymerizable groups as "bifunctional" or "direactive" compounds, and compounds with more than two polymerizable groups as "multifunctional" or "multireactive" compounds. Compounds without a polymerizable group are also referred to as "non-functional" or "non-reactive" compounds.

The term "homopolymer" as used herein, stands for a polymer derived from one species of (real, implicit or hypothetical) monomer.

The term "copolymer" as used herein, generally means any polymer derived from more than one species of monomer, wherein the polymer contains more than one species of corresponding repeating unit. In one embodiment the copolymer is the reaction product of two or more species of monomer and thus comprises two or more species of corresponding repeating unit. It is preferred that the copolymer comprises two, three, four, five or six species of repeating unit. Copolymers that are obtained by copolymerization of three monomer species can also be referred to as terpolymers. Copolymers that are obtained by copolymerization of four monomer species can also be referred to as quaterpolymers. Copolymers may be present as block, random, and/or alternating copolymers.

The term "block copolymer" as used herein, stands for a copolymer, wherein adjacent blocks are constitutionally different, i.e. adjacent blocks comprise repeating units derived from different species of monomer or from the same species of monomer but with a different composition or sequence distribution of repeating units.

Further, the term "random copolymer" as used herein, refers to a polymer formed of macromolecules in, which the probability of finding a given repeating unit at any given site in the chain is independent of the nature of the adjacent repeating units. Usually, in a random copolymer, the sequence distribution of repeating units follows Bernoullian statistics.

The term "alternating copolymer" as used herein, stands for a copolymer consisting of macromolecules comprising two species of repeating units in alternating sequence.

"Siloxanes" are chemical compounds with the general formula $R_3Si[OSiR_2]_nOSiR_3$ or $(RSi)_nO_{3n/2}$, where R can be hydrogen atoms or organic groups and n is an integer $\geq 1$. In contrast to silanes, the silicon atoms of siloxanes are not directly linked to one another, but via an intermediate oxygen atom: Si—O—Si. Depending on the chain length, siloxanes may occur as linear or branched or cubic or ladder shaped or random oligomeric or polymer siloxanes (i.e. oligosiloxanes or polysiloxanes). Siloxanes, where at least one substituent R is an organic group, are called organosiloxanes.

"Halogen" as used herein refers to an element, which belongs to group 17 of the Periodic Table. Group 17 of the Periodic Table comprises the chemically relevant elements fluorine (F), chlorine (Cl), bromine (Br), iodine (I) and astatine (At).

As explained above, "electronic packaging" is a major discipline within the field of electronic engineering, and includes a wide variety of technologies. It refers to inserting discrete components, integrated circuits, and MSI (medium-scale integration) and LSI (large-scale integration) chips (usually attached to a lead frame by beam leads) into plates through hole on multilayer circuit boards (also called cards), where they are soldered in place. Packaging of an electronic system must consider protection from mechanical damage, cooling, radio frequency noise emission, protection from electrostatic discharge maintenance, operator convenience, and cost.

The term "microelectronic device" as used herein, refers to electronic devices of very small electronic designs and components. Usually, but not always, this means micrometer-scale or smaller. These devices typically contain one or more microelectronic components, which are made from semiconductor materials and interconnected in a packaged structure to form the microelectronic device. Many electronic components of normal electronic design are available in a microelectronic equivalent. These include transistors, capacitors, inductors, resistors, diodes and naturally insulators and conductors can all be found in microelectronic devices. Unique wiring techniques such as wire bonding are also often used in microelectronics because of the unusually small size of the components, leads and pads.

The term "field effect transistor" or "FET" as used herein, refers to a transistor that uses an electric filed to control the electrical behavior of the device. FETs are also known as unipolar transistors since they involve single-carrier-type operation. Many different implementations of field effect transistors exist. Field effect transistors generally display very high input impedance at low frequencies. The conductivity between the drain and source terminals is controlled by an electric field in the device, which is generated by the voltage difference between the body and the gate of the device.

The term "thin film transistor" or "TFT" as used herein, refers to a specific kind of transistor made by depositing thin films of an active semiconductor layer as well as a dielectric layer and metallic contacts over a supporting (but non-conducting) substrate. A common substrate is glass, because the primary application of TFTs is in liquid-crystal displays (LCDs). This differs from the conventional transistor, where the semiconductor material typically is the substrate such as a silicon wafer. TFTs may be used to form a TFT array panel for a liquid crystal display (LCD) device.

The term "photoresist" as used herein, refers to a light-sensitive material used in several processes, such as photolithography and photoengraving, to form a patterned coating on a surface. This process is crucial in the electronic industry. The process begins by coating a substrate with a light-sensitive material. A patterned mask is then applied to the surface to block light, so that only unmasked regions of the material will be exposed to light. A solvent, called a developer, is then applied to the surface. In the case of a positive tone photoresist, the photo-sensitive material reacts with light to become more soluble than the unexposed part and the developer will dissolve away the regions that were exposed to light, leaving behind a coating where the mask was placed. In the case of a negative tone photoresist, the photosensitive material is strengthened (either polymerized or cross-linked) by light, and the developer will dissolve away only the regions that were not exposed to light, leaving behind a coating in areas where the mask was not placed.

The term "photoacid" and "photoacid generator" (PAG) as used herein, refer to molecules, which become more acidic upon absorption of light. This is due either to the formation of strong acids upon photodissociation, or to the dissociation of protons upon photoassociation (e.g. ring-closing). There are two main types of molecules that release protons upon illumination: photoacid generators (PAGs) and photoacids (PAHs). PAGs undergo proton photodissociation irreversibly, while PAHs are molecules that undergo proton photodissociation and thermal reassociation. In this case the excited state is strongly acidic, but reversible. An example due to photodissociation is tripheny lsulfonium triflate with the formula $[(C_6H_5)_3S][CF_3SO_3]$. This colorless salt consists of a sulfonium cation and the triflate anion. Many related salts are known including those with other noncoordinating anions and those with diverse substituents on the phenyl rings. The triphenyl sulfonium salts absorb at 233 nm, which induces the series of reactions shown below. As this series of reactions is irreversible, triphenyl sulfonium triflate is a photoacid generator (PAG).

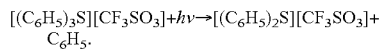

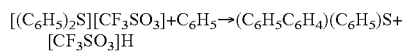

The term "photoactive dissolution modulator" as used herein, refers to a compound, which upon exposure to light converts a photoresist to a derivative being soluble in a suitable developer. During masking and patterning of a photoresist, portions of the photoresist film are exposed to light while others remain unexposed. In the unexposed regions of a positive tone photoresist film, the photoresist remains insoluble in a developer, while in the exposed regions, the photoactive dissolution modulator forms a soluble species which makes the photoresist soluble in a developer.

Preferred Embodiments

Positive Tone Photoresist Formulation

In a first aspect, the present invention relates to a positive tone photoresist formulation comprising:
(a) a siloxane polymer comprising a first repeating unit and a second repeating unit; and
(b) a photoactive dissolution modulator;
wherein the first repeating unit contains at least one maleimide group; and the second repeating unit does not contain a maleimide group.

A maleimide group is a functional group represented by the following structure:

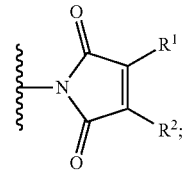

wherein $R^1$ and $R^2$ are the same or different from each other and each independently denotes H or a substituent. If both $R^1$ and $R^2$ are H, the maleimide group is an unsubstituted maleimide group. If at least one of $R^1$ and $R^2$ is a substituent different from H, the maleimide group is a substituted maleimide group.

represents a point of attachment of the maleimide group to the remaining structure of the first repeating unit.

The synthesis of maleimide-functionalized trialkoxysilanes is described in CN 104447849 A.

Siloxane Polymer

The synthesis of siloxane polymers is described in PCT/EP2020/055952 which claims priority from EP Application No. 19161650.7.

First Repeating Unit

In a preferred embodiment, the first repeating unit is derived from a first siloxane monomer, which is represented by the following Formula (1):

Formula (1)

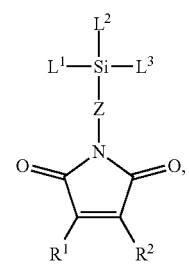

wherein:
L¹, L² and L³ are the same or different from each other and each independently is selected from R, OR, and halogen, wherein at least one of L¹, L² and L³ is OR or halogen;
R is selected from the group consisting of H, straight-chain alkyl having 1 to carbon atoms, branched-chain alkyl having 3 to 30 carbon atoms, cyclic alkyl having 3 to 30 carbon atoms, and aryl having 6 to 20 carbon atoms, wherein one or more non-adjacent and non-terminal $CH_2$ groups are optionally replaced by —O—, —S—, —C(=O)—, —C(=S)—, —C(=O)—O—, —O—C(=O)—, —NR$^O$—, —SiR$^O$R$^{OO}$—, —CF$_2$—, —CR$^O$=CR$^{OO}$—, —CY$^1$=CY$^2$— or —C≡C—, and wherein one or more H atoms are optionally replaced by F;
R¹ and R² are the same or different from each other and each independently is selected from H, alkyl having 1 to 20 carbon atoms, cycloalkyl having 3 to 20 carbon atoms and aryl having 6 to 20 carbon atoms, wherein one or more H atoms are optionally replaced by F, or R¹ and R² together form a mono- or polycyclic organic ring system, wherein one or more H atoms are optionally replaced by F;
Z denotes a straight-chain alkylene group having 1 to 20 carbon atoms, a branched-chain alkylene group having 3 to 20 carbon atoms or a cyclic alkylene group having 3 to 20 carbon atoms, in, which one or more non adjacent and non-terminal $CH_2$ groups are optionally replaced by —O—, —S—, —C(=O)—, —C(=S)—, —C(=O)—O—, —O—C(=O)—, —NR$^O$—, —SiR$^O$R$^{OO}$—, —CF$_2$—, —CR$^O$=CR$^{OO}$—, —CY$^1$=CY$^2$— or —C≡C—, and in, which one or more H atoms are optionally replaced by F;
Y¹ and Y² are the same or different from each other and each independently is selected from H, F, Cl and CN;
R$^O$ and R$^{OO}$ are the same or different from each other and each independently is selected from H, straight-chain alkyl having 1 to 20 carbon atoms and branched-chain alkyl having 3 to 20 carbon atoms, which are optionally fluorinated; and
wherein the second siloxane monomer is different from the first siloxane monomer.

It is preferred that L¹, L² and L³ are the same or different from each other and each independently is selected from R, OR, F, Cl, Br and I, wherein at least one of L¹, L² and L³ is OR, F, Cl, Br or I.

It is more preferred that one of the conditions (1) or (2) applies:

$$L^1=L^2=L^3=OR; \quad (1)$$

or $$L^1=L^2=R, \text{ and } L^3=Cl. \quad (2)$$

In a preferred embodiment, R is selected from the group consisting of H, straight chain alkyl having 1 to 20, preferably 1 to 12, carbon atoms, branched-chain alkyl having 3 to 20, preferably 3 to 12, carbon atoms, cyclic alkyl having 3 to 20, preferably 3 to 12, carbon atoms, and aryl having 6 to 14 carbon atoms, wherein one or more non-adjacent and non-terminal $CH_2$ groups are optionally replaced by —O—, —S—, —C(=O)—, —C(=S)—, —C(=O)—O—, —O—C(=O)—, —NR$^O$—, —SiR$^O$R$^{OO}$—, —CF$_2$—, —CR$^O$=CR$^{OO}$—, —CY$^1$=CY$^2$— or —C≡C—, and wherein one or more H atoms are optionally replaced by F.

In a more preferred embodiment, R is selected from the group consisting of H, straight chain alkyl having 1 to 12 carbon atoms, branched-chain alkyl having 3 to 12 carbon atoms, cyclic alkyl having 3 to 12 carbon atoms, and aryl having 6 to 14 carbon atoms.

In a most preferred embodiment, R is selected from the group consisting of H, —CH$_3$, —CH$_2$CH$_3$, —CH$_2$CH$_2$CH$_3$, —CH(CH$_3$)$_2$, —C$_6$H$_{11}$, and -Ph.

In a preferred embodiment, R¹ and R² are the same or different from each other and each independently is selected from H, alkyl having 1 to 12 carbon atoms, cycloalkyl having 3 to 12 carbon atoms and aryl having 6 to 14 carbon atoms, wherein one or more H atoms are optionally replaced by F, or R¹ and R² together form a mono- or polycyclic aliphatic ring system, a mono- or polycyclic aromatic ring system or a polycyclic aliphatic and aromatic ring system, wherein one or more H atoms are optionally replaced by F.

Preferred mono- or polycyclic aliphatic ring systems have 3 to 20, preferably 5 to 12, ring carbon atoms. Preferred mono- or polycyclic aromatic ring systems have 5 to 20, preferably 6 to 12, ring carbon atoms. Preferred polycyclic aliphatic and aromatic ring system have 6 to 30, preferably 10 to 20, ring carbon atoms.

In a more preferred embodiment, R¹ and R² are the same or different from each and are selected from H, —CH$_3$, —CF$_3$, —CH$_2$CH$_3$, —CF$_2$CF$_3$, —CH$_2$CH$_2$CH$_3$, —CH(CH$_3$)$_2$, or -Ph.

In an even more preferred embodiment, R¹ and R² are the same and selected from —CH$_3$, —CF$_3$, —CH$_2$CH$_3$, —CF$_2$CF$_3$ or -Ph.

In a most preferred embodiment, R¹ and R² are —CH$_3$.

In a preferred embodiment, Z denotes a straight-chain alkylene group having 1 to 12 carbon atoms, a branched-chain alkylene group having 3 to 12 carbon atoms or a cyclic alkylene group having 3 to 12 carbon atoms, in, which one or more non-adjacent and non-terminal $CH_2$ groups are optionally replaced by —O—, —S—, —C(=O)—, —C(=S)—, —C(=O)—O—, —O—C(=O)—, —NR$^O$—, —SiR$^O$R$^{OO}$—, —CF$_2$—, —CR$^O$=CR$^{OO}$—, —CY$^1$=CY$^2$— or —C≡O—, and in, which one or more H atoms are optionally replaced by F.

In a more preferred embodiment, Z denotes a straight-chain alkylene group having 1 to 12 carbon atoms, which is selected from —(CH$_2$)—, —(CH$_2$)$_2$—, (CH$_2$)$_3$—, —(CH$_2$)$_4$—, —(CH$_2$)$_5$—, —(CH$_2$)$_6$—, —(CH$_2$)$_7$—, —(CH$_2$)$_8$—, —(CH$_2$)$_9$—, —(CH$_2$)$_{10}$—, (CH$_2$)$_{11}$—, and —(CH$_2$)$_{12}$—.

In a preferred embodiment, R$^O$ and R$^{OO}$ are the same or different from each other and each independently is selected from H, straight-chain alkyl having 1 to 12 carbon atoms and branched-chain alkyl having 3 to 12 carbon atoms, which are optionally fluorinated.

In a more preferred embodiment, R$^O$ and R$^{OO}$ are the same or different from each other and each independently is selected from H, —CH$_3$, —CF$_3$, —CH$_2$CH$_3$ and —CF$_2$CF$_3$.

In a particularly preferred embodiment, the first repeating unit is derived from a first siloxane monomer, which is represented by the following Formula (2):

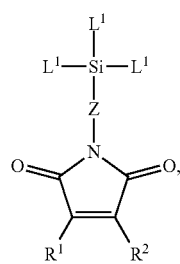

Formula (2)

wherein:
L¹=—OCH₃, —OCF₃, —OCH₂CH₃, —OCF₂CF₃, —OCH₂CH₂CH₃, —OCH(CH₃)₂, OC₆H₁₁, or -Ph;
Z=—(CH₂)ₙ—, wherein n=1 to 10; and
R¹=H, —CH₃, —CF₃, —CH₂CH₃, —CF₂CF₃, or -Ph.

In a most preferred embodiment, the first repeating unit is derived from a first siloxane monomer, which is represented by the following Formula (3) or (4):

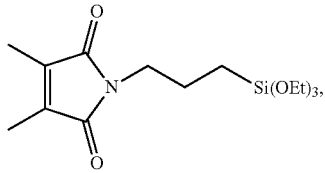

Formula (3)

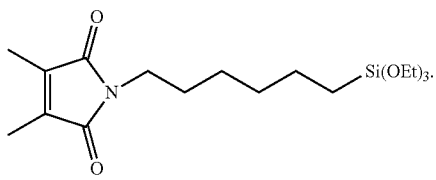

Formula (4)

Second Repeating Unit

In a preferred embodiment, the second repeating unit is derived from a second siloxane monomer, which does not contain a maleimide group and is represented by one of the following Structures S1 or S2:

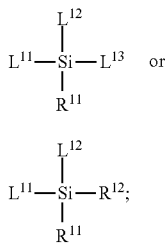

S1

S2 wherein:
L¹¹, L¹², and L¹³ are the same or different from each other and each independently is selected from OR' and halogen;
R' is selected from the group consisting of straight-chain alkyl having 1 to 30 carbon atoms, branched-chain alkyl having 3 to 30 carbon atoms, cyclic alkyl having 3 to 30 carbon atoms, and aryl having 6 to 20, wherein one or more non-adjacent and non-terminal CH₂ groups are optionally replaced by —O—, —S—, —C(=O)—, —C(=S)—, —C(=O)—O—, —O—C(=O)—, —NR⁰—, —SiR⁰R⁰⁰—, —CF₂—, —CR⁰=CR⁰⁰—, —CY¹=CY²— or —C≡O—, and wherein one or more H atoms are optionally replaced by F;
R¹¹, and R¹² are the same or different from each other and each independently is selected from the group consisting of H, straight-chain alkyl having 1 to 30 carbon atoms, branched-chain alkyl having 3 to 30 carbon atoms, cyclic alkyl having 3 to 30 carbon atoms, and aryl having 6 to 20 carbon atoms, which optionally contain one or more functional groups selected from —O—, —S—, —C(=O)—, —C(=S)—, —C(=O)—O—, —O—C(=O)—, —NR⁰—, —SiR⁰R⁰⁰—, —CF₂—, —CR⁰=CR⁰⁰—, —CR⁰=CR⁰⁰2, —CY¹=CY²—, and —C≡O—, and wherein one or more H atoms are optionally replaced by F; and R⁰, R⁰⁰, Y¹, and Y² are defined as shown above.

It is preferred that L¹¹, L¹², and L¹³ are the same or different from each other and each independently is selected from OR', F, Cl, Br and I.

It is more preferred that L¹¹, L¹², and L¹³ are the same or different from each other and each independently is selected from OR'.

In a preferred embodiment, R' is selected from the group consisting of straight chain alkyl having 1 to 20, preferably 1 to 12, carbon atoms, branched-chain alkyl having 3 to 20, preferably 3 to 12, carbon atoms, cyclic alkyl having 3 to 20, preferably 3 to 12, carbon atoms, and aryl having 6 to 14 carbon atoms, wherein one or more non-adjacent and non-terminal CH₂ groups are optionally replaced by —O—, —S—, —C(=O)—, —C(=S)—, —C(=O)—O—, —O—C(=O)—, —NR⁰—, —SiR⁰R⁰⁰—, —CF₂—, —CR⁰=CR⁰⁰—, —CY¹=CY²— or —C≡O—, and wherein one or more H atoms are optionally replaced by F.

In a more preferred embodiment, R' is selected from the group consisting of straight chain alkyl having 1 to 12 carbon atoms, branched-chain alkyl having 3 to 12 carbon atoms, cyclic alkyl having 3 to 12 carbon atoms, and aryl having 6 to 14 carbon atoms.

In a particularly preferred embodiment, R' is selected from the group consisting of —CH₃, —CF₃, —C₂H₅, —C₂F₅, —C₃H₇, —C₃F₇, —C₄H₉, —C₄F₉, —C₅H₁₁, —C₅H₄F₇, —C₆H₁₃, —C₆H₄F₉, —C₇H₁₅, —C₇H₄F₁₁, —C₈H₁₇, —C₈H₄F₁₃, —CH=CH₂, —C(CH₃)=CH₂, —C₆H₅, and —C₆F₅.

In a most preferred embodiment, R¹ is selected from —CH₃, or —C₂H₅.

In a preferred embodiment, R¹¹, and R¹² are the same or different from each other and each independently is selected from the group consisting of H, straight-chain alkyl having 1 to 20, preferably 1 to 12, carbon atoms, branched-chain alkyl having 3 to 20, preferably 3 to 12, carbon atoms, cyclic alkyl having 3 to 20, preferably 3 to 12, carbon atoms, and aryl having 6 to 14 carbon atoms, which optionally contain one or more functional groups selected from —O—, —S—, —C(=O)—, —C(=S)—, —C(=O)—O—, —O—C(=O)—, —NR⁰—, —SiR⁰R⁰⁰—, —CF₂—, —CR⁰=CR⁰⁰—, —CR⁰=CR⁰⁰2, —CY¹=CY²—, and —C≡O—, and wherein one or more H atoms are optionally replaced by F.

In a more preferred embodiment, R¹¹, and R¹² are selected from the group consisting of H, straight-chain alkyl having 1 to 12 carbon atoms, branched-chain alkyl having 3 to 12 carbon atoms, cyclic alkyl having 3 to 12 carbon atoms, and aryl having 6 to 14 carbon atoms, which optionally contain one or more functional groups selected from —C(=O)—, —C(=O)—O—, —O—C(=O)—, —CR⁰=CR⁰⁰—, —CR⁰=CR⁰⁰2, and —CY¹=CY²—, and wherein one or more H atoms are optionally replaced by F.

In a particularly preferred embodiment R¹¹, and R¹² are selected from the group consisting of —CH₃, —CF₃, —C₂H₅, —C₂F₅, —C₃H₇, —C₃F₇, —C₄H₉, —C₄F₉, —C₅H₁₁, —C₅H₄F₇, —C₆H₁₃, —C₆H₄F₉, —C₇H₁₅, —C₇H₄F₁₁, —C₈H₁₇, —C₈H₄F₁₃, —CH=CH₂, —C(CH₃)=CH₂, —C₃H₆—O—C(=O)—CH=CH₂, —C₃H₆—O—C(=O)—C(CH₃)=CH₂, —C₆H₅, and —C₆F₅.

In a most preferred embodiment, R¹¹, and R¹² are selected from —CH₃, or —C₂H₅.

In a particularly preferred embodiment, the second repeating unit is derived from a second siloxane monomer, which is represented by the following Structure S1:

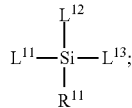

S1 wherein:
- $L^{11}$, $L^{12}$, and $L^{13}$ are the same or different from each other and each independently is selected from OR';
- R' is selected from the group consisting of straight chain alkyl having 1 to 20, preferably 1 to 12, carbon atoms, branched-chain alkyl having 3 to 20, preferably 3 to 12, carbon atoms, cyclic alkyl having 3 to 20, preferably 3 to 12, carbon atoms, and aryl having 6 to 14 carbon atoms, wherein one or more non-adjacent and non-terminal $CH_2$ groups are optionally replaced by —O—, —S—, —C(=O)—, —C(=S)—, —C(=O)—O—, —O—C(=O)—, —$NR^0$—, —$SiR^0R^{00}$—, —$CF_2$—, —$CR^0$=$CR^{00}$—, —$CY^1$=$CY^2$— or —C≡O—, and wherein one or more H atoms are optionally replaced by F.
- $R^{11}$ is selected from the group consisting of H, straight-chain alkyl having 1 to 20, preferably 1 to 12, carbon atoms, branched-chain alkyl having 3 to 20, preferably 3 to 12, carbon atoms, cyclic alkyl having 3 to 20, preferably 3 to 12, carbon atoms, and aryl having 6 to 14 carbon atoms, which optionally contain one or more functional groups selected from —O—, —S—, —C(=O)—, —C(=S)—, —C(=O)—O—, —O—C(=O)—, —$NR^0$—, —$SiR^0R^{00}$—, —$CF_2$—, —$CR^0$=$CR^{00}$—, —$CR^0$=$CR^{00}$2, —$CY^1$=$CY^2$—, and —C≡O—, and wherein one or more H atoms are optionally replaced by F; and
- $R^0$, $R^{00}$, $Y^1$, and $Y^2$ are defined as shown above.

It is particularly preferred that in Structure Si the following applies:
- $R^1$ is selected from the group consisting of straight chain alkyl having 1 to 12 carbon atoms, branched-chain alkyl having 3 to 12 carbon atoms, cyclic alkyl having 3 to 12 carbon atoms, and aryl having 6 to 14 carbon atoms; and $R^{11}$ is selected from the group consisting of —$CH_3$, —$CF_3$, —$C_2H_5$, —$C_2F_5$, —$C_3H_7$, —$C_3F_7$, —$C_4H_9$, —$C_4F_9$, —$C_5H_{11}$, —$C_5H_4F_7$, —$C_6H_{13}$, —$C_6H_4F_9$, —$C_7H_{15}$, —$C_7H_4F_{11}$, —$C_8H_{17}$, —$C_8H_4F_{13}$, —CH=$CH_2$, —C($CH_3$)=$CH_2$, —$C_3H_6$—O—C(=O)—CH=$CH_2$, —$C_3H_6$—O—C(=O)—C($CH_3$)=$CH_2$, —$C_6H_5$, and —$C_6F_5$.

Preferred second siloxane monomers are represented by one of the following structures:

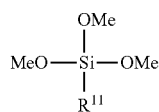

S1-1

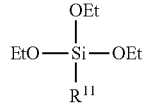

S1-2

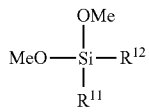

S2-1

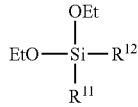

S2-2 wherein:
$R^{11}$ and $R^{12}$ have one of the meanings as defined above.

More preferred second siloxane monomers are represented by one of the following structures:

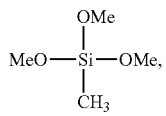

S1-1-1

S1-1-2

S1-1-3

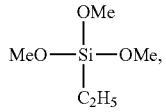

S1-1-4

S1-1-5

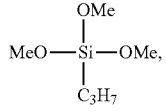

S1-1-6

S1-1-7

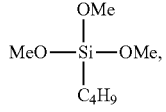

S1-1-8

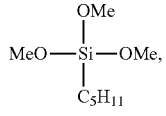

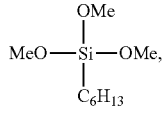

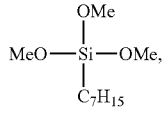

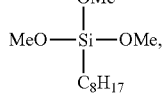

S1-1-9

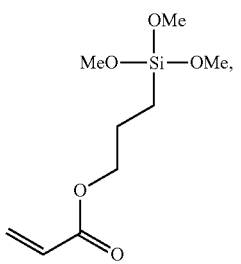
S1-1-10
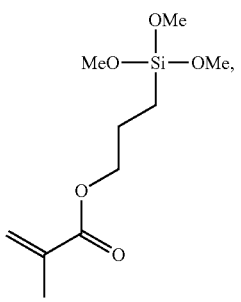
S1-1-11
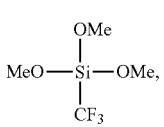
S1-1-12
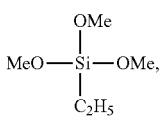
S1-1-13
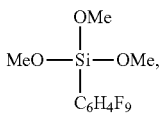
S1-1-14
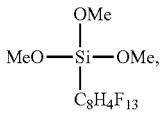
S1-1-15
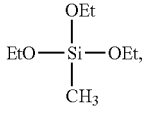
S2-2-1
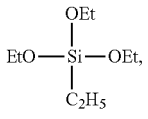
S2-2-2
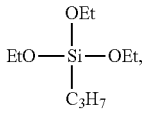
S2-2-3
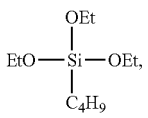
S1-2-4
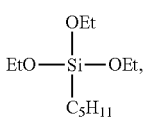
S1-2-5
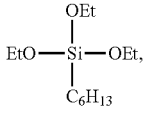
S1-2-6
S1-2-7
S1-2-8
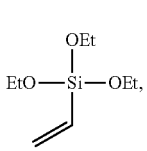
S1-2-9
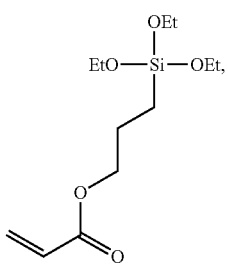
S1-2-10
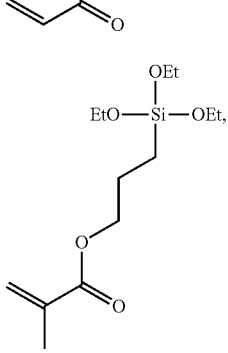
S1-2-11
S1-2-12
S1-2-13
S1-2-14

S1-2-15

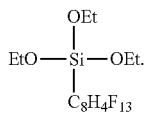

Third Repeating Unit

In a preferred embodiment, the siloxane polymer comprised in the positive tone photoresist formulation according to the present invention further comprises a third repeating unit, wherein the third repeating unit does not contain a maleimide group.

Preferably, the third repeating unit is different from the second repeating unit.

In a preferred embodiment, the third repeating unit is derived from a third siloxane monomer, which is represented by one of the following Structures T1 or T2:

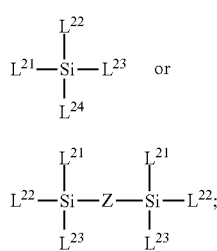

wherein:
$L^{21}$, $L^{22}$, $L^{23}$, and $L^{24}$ are the same or different from each other and each independently is selected from OR" and halogen;
R" is selected from the group consisting of straight-chain alkyl having 1 to 30 carbon atoms, branched-chain alkyl having 3 to 30 carbon atoms, cyclic alkyl having 3 to 30 carbon atoms, and aryl having 6 to 20 carbon atoms, wherein one or more non-adjacent and non-terminal $CH_2$ groups are optionally replaced by —O—, —S—, —C(=O)—, —C(=S)—, —C(=O)—O—, —O—C(=O)—, —NR$^O$—, —SiR$^O$R$^{OO}$—, —CF$_2$—, —CR$^O$=CR$^{OO}$—, —CY$^1$=CY$^2$— or —C≡O—, and wherein one or more H atoms are optionally replaced by F;
Z is absent or denotes a straight-chain alkylene group having 1 to 20 carbon atoms, a branched-chain alkylene group having 3 to 20 carbon atoms or a cyclic alkylene group having 3 to 20 carbon atoms, in which one or more non-adjacent and non-terminal $CH_2$ groups are optionally replaced by —O—, —S—, —C(=O)—, —C(=S)—, —C(=O)—O—, —O—C(=O)—, —NR$^O$—, —SiR$^O$R$^{OO}$—, —CF$_2$—, —CR$^O$=CR$^{OO}$—, —CY$^1$=CY$^2$— or —C≡O—, and in which one or more H atoms are optionally replaced by F; and
$R^O$, $R^{OO}$, $Y^1$, and $Y^2$ are defined as shown above.

It is preferred that $L^{21}$, $L^{22}$, $L^{23}$, and $L^{24}$ are the same or different from each other and each independently is selected from OR", F, Cl, Br and I.

It is more preferred that $L^{21}$, $L^{22}$, $L^{23}$, and $L^{24}$ are the same or different from each other and each independently is selected from OR".

For R" the preferred, more preferred, particularly preferred and most preferred definitions, as disclosed above for R', apply, correspondingly.

In a preferred embodiment, Z is absent or denotes a straight-chain alkylene group having 1 to 12 carbon atoms, a branched-chain alkylene group having 3 to 12 carbon atoms or a cyclic alkylene group having 3 to 12 carbon atoms, in which one or more non-adjacent and non-terminal $CH_2$ groups are optionally replaced by —O—, —S—, —C(=O)—, —C(=S)—, —C(=O)—O—, —O—C(=O)—, —NR$^O$—, —SiR$^O$R$^{OO}$—, —CF$_2$—, —CR$^O$=CR$^{OO}$—, —CY$^1$=CY$^2$— or —C≡O—, and in which one or more H atoms are optionally replaced by F, wherein $R^O$, $R^{OO}$, $Y^1$, and $Y^2$ are defined as shown above.

In a more preferred embodiment, Z is absent or denotes a straight-chain alkylene group having 1 to 12 carbon atoms which is selected from —(CH$_2$)—, —(CH$_2$)$_2$—, —(CH$_2$)$_3$—, —(CH$_2$)$_4$—, —(CH$_2$)$_5$—, —(CH$_2$)$_6$—, —(CH$_2$)$_7$—, —(CH$_2$)$_8$—, —(CH$_2$)$_9$—, —(CH$_2$)$_{19}$—, —(CH$_2$)$_{11}$—, and —(CH$_2$)$_{12}$—.

In a particularly preferred embodiment, the third repeating unit is derived from a third siloxane monomer, which is represented by the following Structure T1:

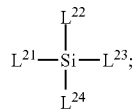

wherein:
$L^{21}$, $L^{22}$, $L^{23}$, and $L^{24}$ are the same or different from each other and each independently is selected from OR";
R" is selected from the group consisting of straight chain alkyl having 1 to 20, preferably 1 to 12, carbon atoms, branched-chain alkyl having 3 to 20, preferably 3 to 12, carbon atoms, cyclic alkyl having 3 to 20, preferably 3 to 12, carbon atoms, and aryl having 6 to 14 carbon atoms, wherein one or more non-adjacent and non-terminal $CH_2$ groups are optionally replaced by —O—, —S—, —C(=O)—, —C(=S)—, —C(=O)—O—, —O—C(=O)—, —NR$^O$—, —SiR$^O$R$^{OO}$—, —CF$_2$—, —CR$^O$=CR$^{OO}$—, —CY$^1$=CY$^2$— or —C≡C—, and wherein one or more H atoms are optionally replaced by F; and
$R^O$, $R^{OO}$, $Y^1$, and $Y^2$ are defined as shown above.

In an alternative particularly preferred embodiment, the third repeating unit is derived from a third siloxane monomer, which is represented by the following Structure T2:

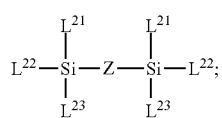

wherein
$L^{21}$, $L^{22}$, and $L^{23}$ are the same or different from each other and each independently is selected from OR";
R" is selected from the group consisting of straight chain alkyl having 1 to 20, preferably 1 to 12, carbon atoms, branched-chain alkyl having 3 to 20, preferably 3 to 12, carbon atoms, cyclic alkyl having 3 to 20, preferably 3 to 12, carbon atoms, and aryl having 6 to 14 carbon atoms, wherein one or more non-adjacent and non-terminal $CH_2$ groups are optionally replaced by —O—, —S—, —C(=O)—, —C(=S)—, —C(=O)—O—, —O—C(=O)—, —NR⁰—, —SiR⁰R⁰⁰—, —CF₂—, —CR⁰=CR⁰⁰—, —CY¹=CY²— or —C≡C—, and wherein one or more H atoms are optionally replaced by F;

Z is absent or denotes a straight-chain alkylene group having 1 to 12 carbon atoms, a branched-chain alkylene group having 3 to 12 carbon atoms or a cyclic alkylene group having 3 to 12 carbon atoms, in, which one or more non-adjacent and non-terminal CH₂ groups are optionally replaced by —O—, —S—, —C(=O)—, —C(=S)—, —C(=O)—O—, —O—C(=O)—, —NR⁰—, —SiR⁰R⁰⁰—, —CF₂—, —CR⁰=CR⁰⁰—, —CY¹=CY²— or —C≡O—, and in, which one or more H atoms are optionally replaced by F; and R⁰, R⁰⁰, Y¹, and Y² are defined as shown above.

Preferred third siloxane monomers are represented by one of the following structures:

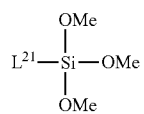   T1-1

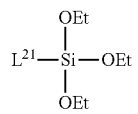   T1-2

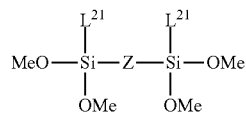   T2-1

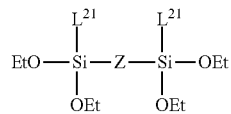   T2-2 wherein:

L²¹ and Z have one of the meanings as defined above.

More preferred third siloxane monomers are represented by one of the following structures:

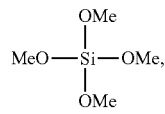   T1-1-1

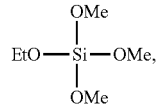   T1-1-2

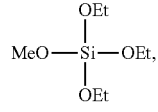   T1-2-1

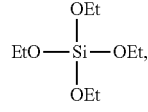   T1-2-2

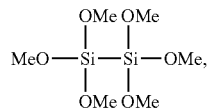   T2-1-1

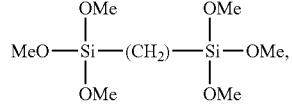   T2-1-2

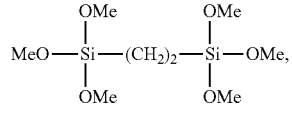   T2-1-3

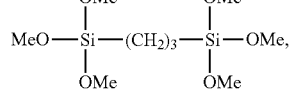   T2-1-4

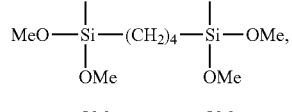   T2-1-5

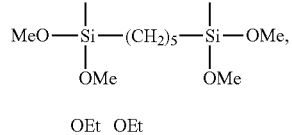   T2-1-6

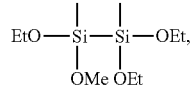   T2-2-1

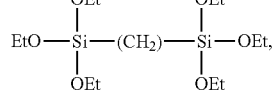   T2-2-2

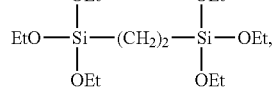   T2-2-3

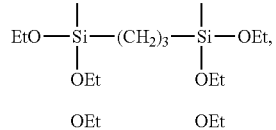   T2-2-4

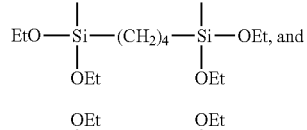   T2-2-5

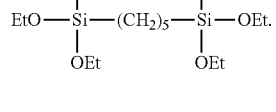   T2-2-6

Mole Fractions of First, Second and Third Repeating Unit

It is preferred that the mole fraction of the first repeating unit in the siloxane polymer is in the range from 1 to 90%, preferably 5 to 70%, more preferably 10 to 50%, even more preferably 10 to 40%, and most preferably 10 to 30%, based on the total amount of repeating units in the siloxane polymer.

It is preferred that the mole fraction of the second repeating unit in the siloxane polymer is in the range from 10 to 90%, preferably 30 to 80%, more preferably 40 to 60%, even more preferably 45 to 55%, and most preferably 50%, based on the total amount of repeating units in the siloxane polymer.

It is further preferred that the mole fraction of the first repeating unit in the siloxane polymer is in the range from 1 to 90%, preferably 5 to 70%, more preferably 10 to 50%, even more preferably 10 to 40%, and most preferably 10 to 30%, and that the mole fraction of the second repeating unit in the siloxane polymer is in the range from 10 to 90%, preferably 30 to 80%, more preferably 40 to 60%, even more preferably 45 to 55%, and most preferably 50%, based on the total amount of repeating units in the siloxane polymer.

It is preferred that the mole fraction of the third repeating unit in the siloxane polymer is in the range from 0 to 50%, preferably 5 to 40%, more preferably 10 to 30%, and most preferably 20 to 30%, based on the total amount of repeating units in the siloxane polymer.

It is further preferred that the mole fraction of the first repeating unit in the siloxane polymer is in the range 1 to 90%, preferably 5 to 70%, more preferably 10 to 50%, even more preferably 10 to 40%, and most preferably 10 to 30%, and that the mole fraction of the second repeating unit in the siloxane polymer is in the range from 10 to 90%, preferably 30 to 80%, more preferably 40 to 60%, even more preferably 45 to 55%, and most preferably 50%, and that the mole fraction of the third repeating unit in the siloxane polymer is in the range from 0 to 50%, preferably 5 to 40%, more preferably 10 to 30%, and most preferably 20 to 30%, based on the total amount of repeating units in the siloxane polymer.

The mole fractions of the repeating units present in the siloxane polymer add up to 100% in total.

Further Repeating Unit

In a preferred embodiment, the siloxane polymer comprised in the positive tone photoresist formulation according to the present invention further comprises one or more further repeating unit, wherein the one or more further repeating unit does not contain a maleimide group.

Preferably, the one or more further repeating unit is different from the second repeating unit and from the third repeating unit.

In a preferred embodiment, the one or more further repeating unit is derived from one or more further siloxane monomer, which is represented by the following Structure F1:

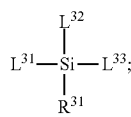

F1 wherein:
$L^{31}$, $L^{32}$, and $L^{33}$ are the same or different from each other and each independently is selected from OR''' and halogen;
R''' is selected from the group consisting of straight-chain alkyl having 1 to 30 carbon atoms, branched-chain alkyl having 3 to 30 carbon atoms, cyclic alkyl having 3 to 30 carbon atoms, and aryl having 6 to 20 carbon atoms, wherein one or more non-adjacent and non-terminal $CH_2$ groups are optionally replaced by —O—, —S—, —C(=O)—, —C(=S)—, —C(=O)—O—, —O—C(=O)—, —NR$^O$—, —SiR$^O$R$^{OO}$—, —CF$_2$—, —CR$^O$=CR$^{OO}$—, —CY$^1$=CY$^2$— or —C≡C—, and wherein one or more H atoms are optionally replaced by F;

$R^{31}$ is selected from the group consisting of H, straight-chain alkyl having 1 to 30 carbon atoms, branched-chain alkyl having 3 to 30 carbon atoms, cyclic alkyl having 3 to 30 carbon atoms, and aryl having 6 to 20 carbon atoms, which optionally contain one or more functional groups selected from —O—, —S—, —C(=O)—, —C(=S)—, —C(=O)—O—, —O—C(=O)—, —NR$^O$—, —SiR$^O$R$^{OO}$—, —CF$_2$—, —CR$^O$=CR$^{OO}$—, —CR$^O$=CR$^{OO}$2, —CY$^1$=CY$^2$—, and —C≡O—, and wherein one or more H atoms are optionally replaced by F; and R$^O$, R$^{OO}$, Y$^1$, and Y$^2$ are defined as shown above.

It is preferred that $L^{31}$, $L^{32}$, and $L^{33}$ are the same or different from each other and each independently is selected from OR''', F, Cl, Br and I.

It is more preferred that $L^{31}$, $L^{32}$, and $L^{33}$ are the same or different from each other and each independently is selected from OR'''.

For R''' the preferred, more preferred, particularly preferred and most preferred definitions, as disclosed above for R', apply, correspondingly.

In a preferred embodiment, $R^{31}$ is selected from the group consisting of H, straight-chain alkyl having 1 to 20, preferably 1 to 12, carbon atoms, branched-chain alkyl having 3 to 20, preferably 3 to 12, carbon atoms, cyclic alkyl having 3 to 20, preferably 3 to 12, carbon atoms, and aryl having 6 to 14 carbon atoms, which optionally contain one or more functional groups selected from —O—, —S—, —C(=O)—, —C(=S)—, —C(=O)—O—, —O—C(=O)—, —NR$^O$—, —SiR$^O$R$^{OO}$—, —CF$_2$—, —CR$^O$=CR$^{OO}$—, —CR$^O$=CR$^{OO}$2, —CY$^1$=CY$^2$—, and —C≡O—, and wherein one or more H atoms are optionally replaced by F.

In a more preferred embodiment, $R^{31}$ is selected from the group consisting of H, straight-chain alkyl having 1 to 12 carbon atoms, branched-chain alkyl having 3 to 12 carbon atoms, cyclic alkyl having 3 to 12 carbon atoms, and aryl having 6 to 14 carbon atoms, which optionally contain one or more functional groups selected from —C(=O)—, —C(=O)—O—, —O—C(=O)—, —CR$^O$=CR$^{OO}$—, —CR$^O$=CR$^{OO}$2, and —CY$^1$=CY$^2$—, and wherein one or more H atoms are optionally replaced by F.

In a particularly preferred embodiment $R^{31}$ is selected from the group consisting of —CH$_3$, —CF$_3$, —C$_2$H$_5$, —C$_2$F$_5$, —C$_3$H$_7$, —C$_3$F$_7$, —C$_4$H$_9$, —C$_4$F$_9$, —C$_5$H$_{11}$, —C$_5$H$_4$F$_7$, —C$_6$H$_{13}$, —C$_6$H$_4$F$_9$, —C$_7$H$_{15}$, —C$_7$H$_4$F$_{11}$, —C$_8$H$_{17}$, —C$_8$H$_4$F$_{13}$, —CH=CH$_2$, —C(CH$_3$)=CH$_2$, —C$_3$H$_6$—O—C(=O)—CH=CH$_2$, —C$_3$H$_6$—O—C(=O)—C(CH$_3$)=CH$_2$, —C$_6$H$_5$, and —C$_6$F$_5$.

In a most preferred embodiment, $R^{31}$ is selected from —C$_6$H$_5$, and —C$_6$F$_5$.

Preferred further siloxane monomers are represented by one of the following structures:

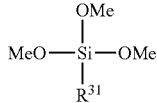

F1-1

-continued

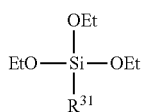

F1-2 wherein:

R³¹ has one of the meanings as defined above.

More preferred further siloxane monomers are represented by one of the following structures:

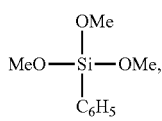

F1-1-1

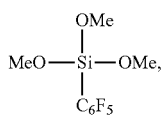

F1-1-2

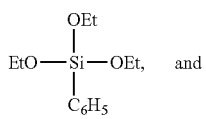

F1-2-1 and

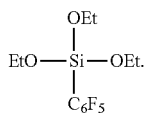

F1-2-2

It is preferred that the mole fraction of the one or more further repeating unit in the siloxane polymer is in the range from 0 to 50%, preferably 5 to 40%, more preferably 10 to 30%, and most preferably 20 to 30%, based on the total amount of repeating units in the siloxane polymer.

The mole fraction of the one or more further repeating unit adds up to 100% with the molar fractions of the first repeating unit, the second repeating unit, and optionally the third repeating unit present in the siloxane polymer.

Chemical and Physical Features of Siloxane Polymer The expression "derived from a specific siloxane monomer" means that the related repeating unit of the siloxane polymer is formed by a condensation reaction of the specific siloxane monomer with another monomer, usually while retaining characteristic structural features of the specific siloxane monomer in the associated repeating unit forming part of the siloxane polymer.

The siloxane polymers used in the present invention may have a linear and/or branched structure. Branched structures include, e.g. ladders, closed cages, open cages and amorphous structures.

Preferably, the siloxane polymers used in the present invention have a molecular weight $M_W$, as determined by GPC, of at least 500 g/mol, more preferably of at least 1,000 g/mol, even more preferably of at least 2,000 g/mol. Preferably, the molecular weight $M_W$ of the siloxane oligomers or polymers is less than 50,000 g/mol, more preferably less than 30,000 g/mol, even more preferably less than 10,000 g/mol.

Influence of Repeating Units in Siloxane Polymer

The first repeating unit increases pattern characteristics and reduces flow during flood exposure and post-baking treatment (see FIG. 1, steps IV and V). Furthermore, pattern flexibility is increased.

The second repeating unit allows adjustment of certain properties of the photoresist formulation such as e.g. alkali dissolution rate (ADR), molecular weight distribution, thermal and mechanical properties.

The presence of the third repeating unit in the siloxane polymer reduces flow and increases pattern characteristics during flood exposure and post-baking treatment (see FIG. 1, steps IV and V). Furthermore, mechanical properties of the pattern are increased.

The presence of one or more further repeating unit allows fine adjustment of certain properties of the photoresist formulation such as mechanical properties, solubility rates, etc..

Photoactive Dissolution Modulator

The positive tone photoresist formulation according to the present invention comprises a photoactive dissolution modulator. The photoactive dissolution modulator is a compound, which upon exposure to light converts a photoresist to a derivative that is soluble in a suitable developer. During masking and patterning of a positive tone photoresist, portions of the photoresist film are exposed to light while others remain unexposed. In the unexposed regions, the resist remains insoluble in a developer, while in the exposed regions, the photoactive dissolution modulator forms a soluble species which enables solubility of the resist in a developer.

In the present invention, the photoactive dissolution modulator, upon exposure to light, converts the siloxane polymer to a derivative being soluble in a developer.

It is preferred that the photoactive dissolution modulator is selected from the list consisting of diazonaphthoquinone (DNQ) or derivatives thereof. Here, the diazonaphthoquinone derivative is a compound prepared by esterification of naphthoquinone diazide sulfonic acid with a compound having a phenolic hydroxyl group, but not limited in particular with respect to structure, and preferably an ester compound with a compound having one or more phenolic hydroxyl groups. As the naphthoquinone diazide sulfonic acid, 4-naphthoquinone diazide sulfonic acid or 5-naphthoquinone diazide sulfonic acid can be used. Due to the presence of absorption in the i-line (wavelength: 365 nm) region, the 4-naphthoquinone diazide sulfonic acid ester compound is suitable for i-line exposure. Furthermore, due to the presence of absorption at a wide range of wavelength region, the 5-naphthoquinone diazide sulfonic acid ester compound is suitable for exposure in a wide range of wavelength. Depending on the exposing wavelength, it is preferable to select the 4-naphthoquinone diazide sulfonic acid ester compound or the 5-naphthoquinone diazide sulfonic acid ester compound. It is also possible to use a mixture of the 4-naphthoquinone diazide sulfonic acid ester compound and the 5-naphthoquinone diazide sulfonic acid ester compound.

The compound having a phenolic hydroxyl group is not particularly limited, but includes, for example, the following compounds (trade name, manufactured by Honshu Chemical Industry Co., Ltd.):

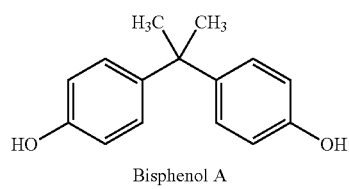

Bisphenol A

-continued
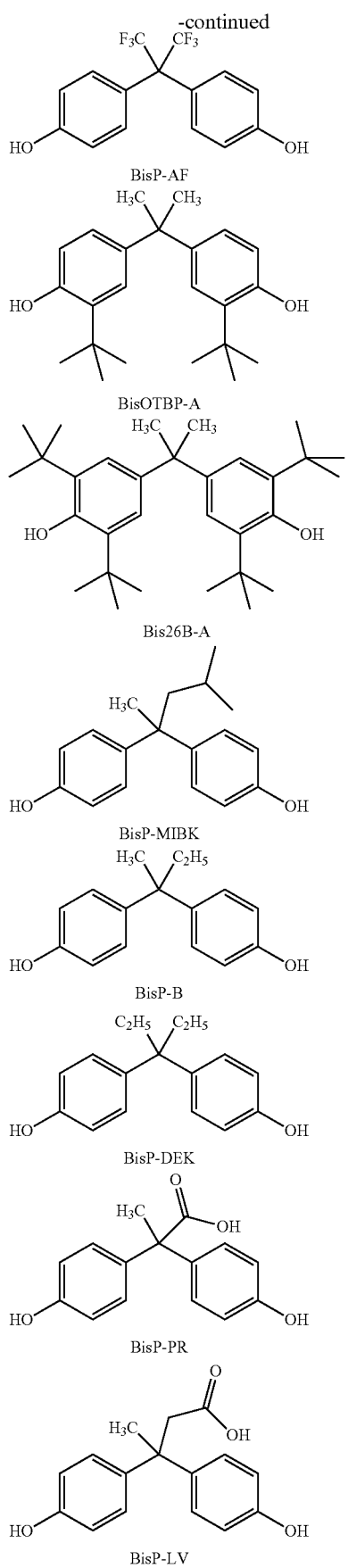
-continued
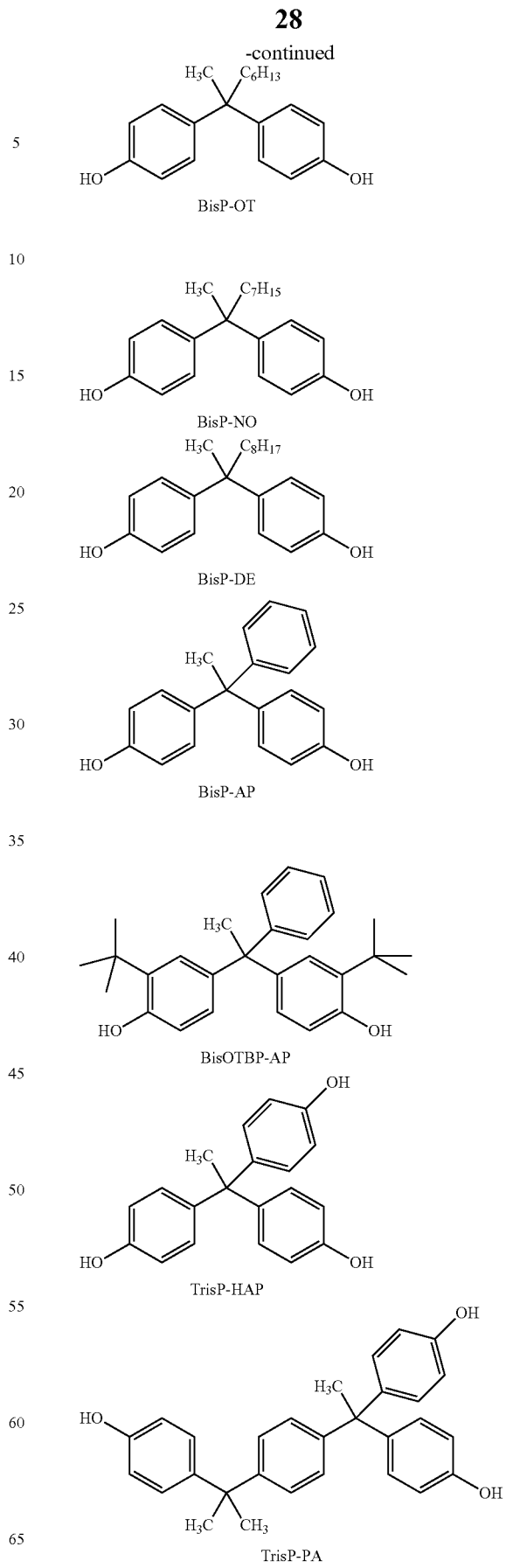

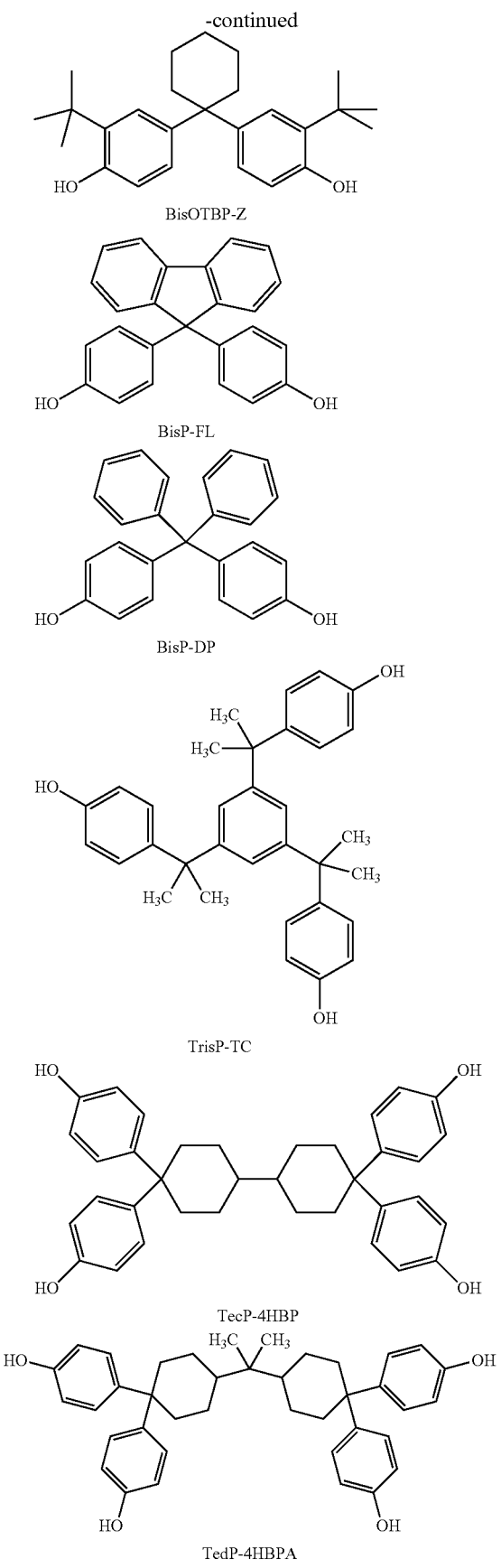

A particularly preferred diazonaphthoquinone derivative is 4,4'-(1-(4-(1-(4-hydroxy-phenyl)-1-methylethyl)phenyl)ethylidene)bisphenol (TrisP-PA) modified with 2.0 mole of naphthoquinone diazide sulfonic acid.

Although the optimum amount varies depending on esterification ratio of naphthoquinone diazide sulfonic acid, or properties of polysiloxane used, required sensitivity, and dissolution contrast between the exposed portion and the unexposed portion, the addition amount of the diazonaphthoquinone derivatives is preferably from 3 to 20 wt.-%, more preferably 5 to 15 wt.-%, based on the total weight of the siloxane polymer. If the addition amount of the diazonaphthoquinone derivative is 3 wt.-% or more, the dissolution contrast between the exposed portion and the unexposed portion becomes high and good photosensitivity is obtained. Further, in order to obtain better dissolution contrast, it is preferably to use 5 wt.-% or more. On the other hand, when the amount of the diazonaphthoquinone derivative is 20 wt.-% or less, the colorless transparency of the cured film is improved.

Further Components

It is preferred that the positive tone photoresist formulation according to the present invention comprises one or more further siloxane polymers, wherein the further siloxane polymers do not contain maleimide groups.

It is preferred that the positive tone photoresist formulation according to the present invention comprises one or more solvents. Examples of the solvent include ethylene glycol monoalkyl ethers, such as ethylene glycol monomethyl ether, ethylene glycol monoethyl ether, ethylene glycol monopropyl ether and ethylene glycol monobutyl ether; diethylene glycol dialkyl ethers, such as diethylene glycol dimethyl ether, diethylene glycol diethyl ether, diethylene glycol dipropyl ether and diethylene glycol dibutyl ether; ethylene glycol alkyl ether acetates, such as methyl cellosolve acetate and ethyl cellosolve acetate; propylene glycol monoalkyl ethers, such as propylene glycol monomethyl ether and propylene glycol monoethyl ether; propylene glycol alkyl ether acetates, such as PGMEA, propylene glycol monoethyl ether acetate and propylene glycol monopropyl ether acetate; aromatic hydrocarbons, such as benzene, toluene and xylene; ketones, such as methyl ethyl ketone, acetone, methyl amyl ketone, methyl isobutyl ketone and cyclohexanone; and the like. These solvents are used individually or in combination of two or more, respectively. Blending ratio of the solvent varies depending on coating method or requirement of the film thickness after the coating.

Preferred solvents are polar solvents, such as e.g. alcohol solvents, and ester solvents. Preferred alcohol solvents are ethanol, propan-1-ol, propan-2-ol, and propylene glycol methyl ether (PGME). Preferred ester solvents are 1-methoxy-2-propylacetat (PGMEA).

The positive tone photoresist formulation may further contain a surfactant. Using of a surfactant may be preferred to improve the coating properties. The surfactants which can be used include nonionic surfactants, anionic surfactants, ampholytic surfactants, and the like.

Examples of nonionic surfactants include, polyoxyethylene alkyl ethers, such as polyoxyethylene lauryl ether, polyoxyethylene oleyl ether and polyoxyethylene cetyl ether; polyoxyethylene fatty acid diester; polyoxyethylene fatty acid monoester; polyoxyethylene polyoxypropylene block polymer; acetylene alcohol; acetylene glycol; polyethoxylate of acetylene alcohol; acetylene glycol derivatives, such as polyethoxylate of acetylene glycol; fluorine-containing surfactants, for example, FLUORAD (trade name, manufactured by Sumitomo 3M Limited), MEGA-FAC (trade name: manufactured by DIC Cooperation), SURFLON (trade name, manufactured by Asahi Glass Co. Ltd.); or organosiloxane surfactants, for example, KP341 (trade name, manufactured by Shin-Etsu Chemical Co., Ltd.), and the like. Examples of said acetylene glycol include 3-methyl-1-butyne-3-ol, 3-methyl-1-pentyn-3-ol, 3,6-dimethyl-4-octyne-3,6-diol, 2,4,7,9-tetramethyl-S-decyne-4,7-diol, 3,5-dimethyl-1-hexyne-3-ol, 2,5-dimethyl-3-hexyne-2,5-diol, 2,5-dimethyl-2,5-hexane-diol, and the like.

Examples of anionic surfactants include ammonium salt or organic amine salt of alkyl diphenyl ether disulfonic acid, ammonium salt or organic amine salt of alkyl diphenyl ether sulfonic acid, ammonium salt or organic amine salt of alkyl benzene sulfonic acid, ammonium salt or organic amine salt of polyoxyethylene alkyl ether sulfuric acid, ammonium salt or organic amine salt of alkyl sulfuric acid, and the like.

Examples of amphoteric surfactant include 2-alkyl-N-carboxymethyl-N-hydroxyethyl imidazolium betaine, lauric acid amide propyl hydroxysulfone betaine, and the like.

These surfactants can be used individually or in combination of two or more, and the blending ratio thereof is usually 50 to 10,000 ppm, preferably 100 to 5,000 ppm, based on the total mass of the siloxane composition.

It is preferred that the positive tone photoresist formulation comprises one or more initiators, such as e.g. photochemically activated initiators or thermally activated initiators. Preferred photochemically activated initiators are photoinitiators, which create reactive species, such as e.g. free radicals, cations or anions, when exposed to radiation, such as e.g. UV or visible light. Suitable photoinitiators are e.g. Omnipol series (e.g. Omnipol TX) and Speedcure series (e.g. Speedcure 7010). Preferred thermally activated initiators are thermal initiators, which create reactive species, such as e.g. free radicals, cations or anions, when exposed to heat.

The addition of Omnipol TX allows irradiation for curing at longer wavelengths of about 365 nm compared to about 254 nm for standard formulation.

In a particularly preferred embodiment of the present invention, the positive tone photoresist formulation comprises a photoinitiator.

The total amount of initiator in the positive tone photoresist formulation is preferably in the range from 0.01 to 10 wt.-%, more preferably from 0.5 to 5 wt.-%, based on the total weight of siloxane polymer.

It is further preferred that the positive tone photoresist formulation does not comprise a photoacid generator (PAG). However, if PAGs are required for other purposes, PAGs include diazomethane compounds, triazine compounds, sulfonic acid esters, diphenyl iodonium salts, triphenyl sulfonium salts, sulfonium salts, ammonium salts, phosphonium salts, sulfonimide compounds, and the like.

The positive tone photoresist formulation may further contain a curing promoter. As the curing promoter, a thermal acid generator or a thermal base generator may be used. Examples of thermal acid generators include salts or esters capable of generating an organic acid, for example, various aliphatic sulfonic acids and salts thereof, various aliphatic carboxylic acids, such as citric acid, acetic acid and maleic acid, and salts thereof, various aromatic carboxylic acids, such as benzoic acid and phthalic acid, and salts thereof, aromatic sulfonic acids and their ammonium salts, various amine salts, aromatic diazonium salts, and phosphonic acids and salts thereof. Among the thermal acid generators, in particular, salts composed of an organic acid and an organic base are preferred and salts composed of a sulfonic acid and an organic base are more preferred.

Preferred sulfonic acids include p-toluenesulfonic acid, benzenesulfonic acid, p-dodecylbenzenesulfonic acid, 1,4-naphthalenedisulfonic acid, methanesulfonic acid, and the like. These acid generators may be used individually or mixed together.

Examples of thermal base generators include compounds that generate a base, such as imidazole, tertiary amine and quaternary ammonium, and mixtures thereof. Examples of bases to be released include imidazole derivatives, such as N-(2-nitrobenzyloxycarbonyl)imidazole, N-(3-nitrobenzyloxycarbonyl)imidazole, N-(4-nitrobenzyloxycarbonyl)imidazole, N-(5-methyl-2-nitrobenzyloxycarbonyl)imidazole, N-(4-chloro-2-nitrobenzyloxycarbonyl)imidazole, and 1,8-diazabicyclo[5.4.0]undecene-7. Like the acid generators, these base generators may be used individually or mixed together.

It is preferred that the positive tone photoresist formulation further comprises one or more inorganic filler materials. Preferred inorganic filler materials are selected from nitrides, titanates, diamond, oxides, sulfides, sulfites, sulfates, silicates and carbides, which may be optionally surface-modified with a capping agent. More preferably, the filler material is selected from the list consisting of AlN, $Al_2O_3$, BN, $BaTiO_3$, $B_2O_3$, $Fe_2O_3$, $SiO_2$, $TiO_2$, $ZrO_2$, PbS, SiC, diamond and glass particles.

Preferably, the total content of the inorganic filler material in the positive tone photoresist formulation is in the range from 0.001 to 90 wt.-%, more preferably 0.01 to 70 wt.-% and most preferably 0.01 to 50 wt.-%, based on the total weight of the composition.

The positive tone photoresist formulation of the present invention may comprise one or more additives, selected from diamines, diols, dicarboxylic acids, polyhedral oligomeric silsesquioxanes (POSSs), edge-modified silsesquioxanes, small aromatic or aliphatic compounds, and nanoparticles, which may be optionally modified with maleimide- or dimethyl maleimide groups.

Modified POSS compounds can be readily prepared from available precursors, and are easily incorporated into the crosslinkable composition by appropriate mixing conditions. For example, maleimide substituted POSS compounds and their preparation are described in US 2006/0009578 A1 the disclosure of, which is herewith incorporated by reference.

Preferred additives are selected from:

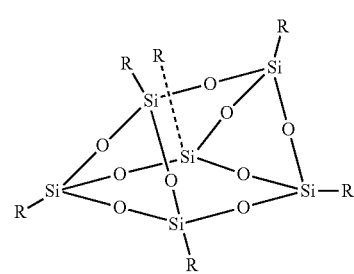

A1

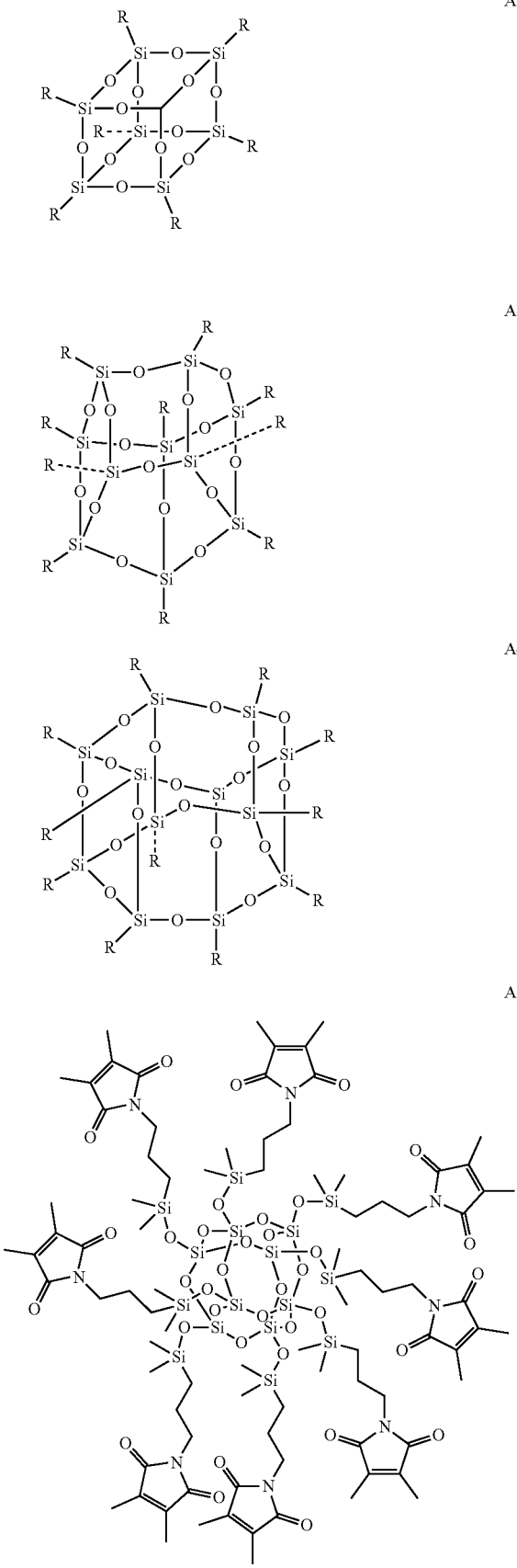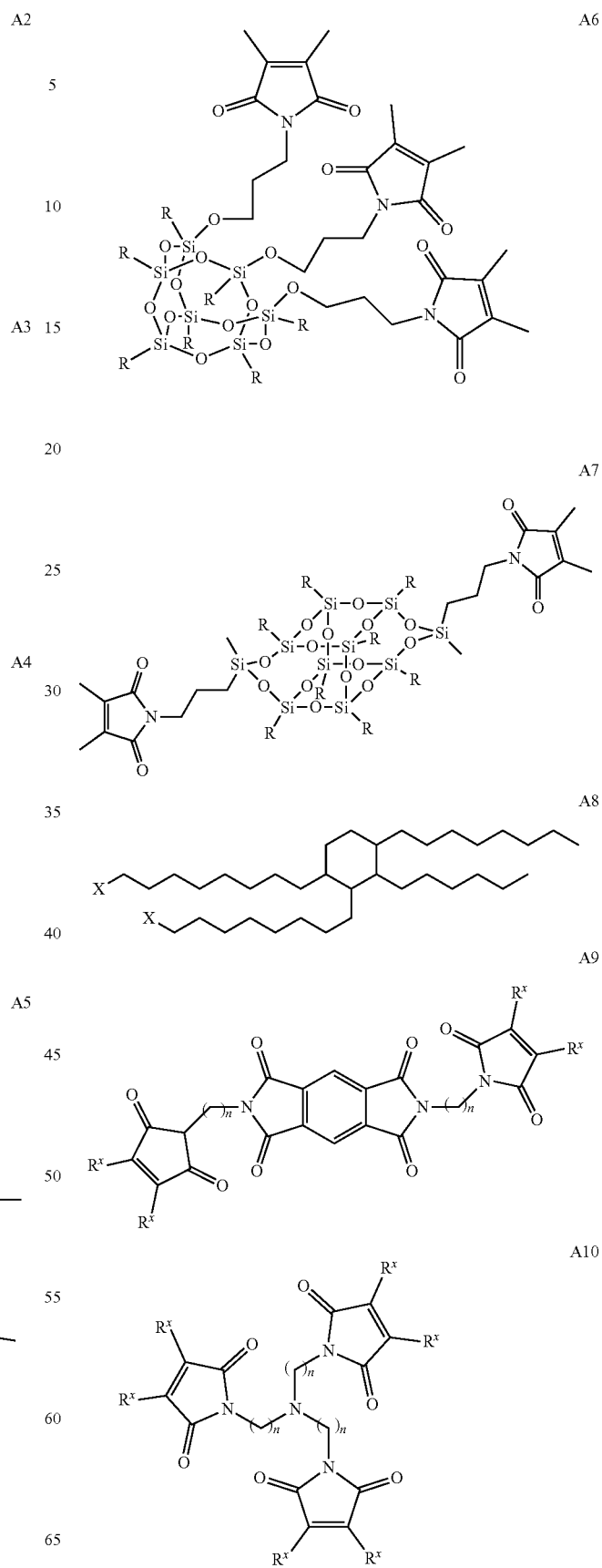

-continued

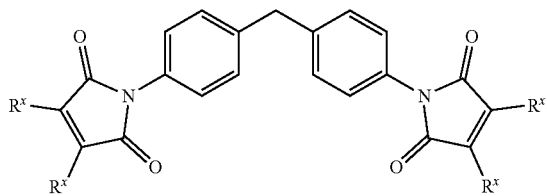
A11 wherein:
R=

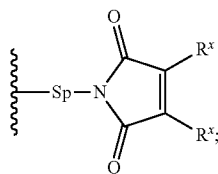

X=—OH, —NH$_2$, —CO$_2$H, or

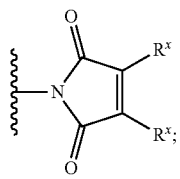

Sp=—CH$_2$—, —CH$_2$CH$_2$—, —CH$_2$CH$_2$CH$_2$—, —CH$_2$CH$_2$CH$_2$CH$_2$—, or —Si(CH$_3$)$_2$—CH$_2$—CH$_2$—CH$_2$—;
R$^x$=H, —CH$_3$, CF$_3$, CN or —CH$_2$CH$_3$; and
n=1 to 36, preferably 1 to 20, more preferably 1 to 12.

Method for Manufacturing Microelectronic Structure

In a second aspect, the present invention provides a method for manufacturing a microelectronic structure, preferably a packaged microelectronic structure, a FET structure or a TFT structure, comprising the following steps:
(1) applying a positive tone photoresist formulation according to the present invention to a surface of a substrate, preferably to a surface of a conducting or semiconducting substrate;
(2) photopatterning of the positive tone photoresist formulation applied in step (1), preferably by (2a) irradiating the applied positive tone photoresist formulation with light having a specific wavelength through a mask, and (2b) developing the irradiated positive tone photoresist formulation by exposing it to a developer and a washing liquid, to obtain a photopatterned structure; and
(3) curing the photopatterned structure obtained in step (2), preferably by (3a) exposing the photopatterned structure to a UV light irradiation, and (3b) subjecting it to a post-baking treatment, to obtain a cured photopatterned dielectric material on the surface of the substrate.

The cured photopatterned dielectric material on the surface of the substrate preferably passivates and optionally planarizes the surface of the substrate.

It is preferred that the surface of the substrate to, which the positive tone photoresist formulation is applied in step (1) can be made of different materials such as e.g. conducting or semiconducting materials, passivation, protective, or planarization layers, etc.. Preferred conducting materials are metals such as e.g. aluminum, molybdenum, titanium, nickel, copper, silver, metal alloys and so on. Preferred semiconducting materials are metal oxides such as indium gallium zinc oxide (IGZO), indium zinc oxide (IZO) or amorphous silicon and poly silicon. Preferred passivation, protective or planarization layers can be made of any polymeric material e.g. polyimides, polybenzylcyclobutanes, silicon nitride, silicon oxynitride, silicon oxide, silicon carbide, etc..

It is preferred that the positive tone photoresist formulation, which is applied in step (1), comprises one or more initiators. Preferred initiators are described above.

In case the positive tone photoresist formulation contains a solvent, it is preferred that the formulation has a certain concentration of the siloxane polymer depending on the desired film thickness. For adjusting the concentration of the siloxane polymer, the solvent is removed by heating, more preferably by heating to 80 to 120° C. Preferred concentrations of the siloxane polymer are in the range from 1 to 50 wt.-%, more preferably 10 to 40 wt.-%, an most preferably 20 to 30 wt.-%, based on the total weight of the siloxane polymer and solvent in the formulation.

The method by which the positive tone photoresist formulation is applied in step (1) is not particularly limited. Preferred application methods for step (1) are dispensing, dipping, screen printing, stencil printing, roller coating, spray coating, slot coating, slit coating, spin coating, stereolithography, gravure printing, flexo printing or inkjet printing.

The positive tone photoresist formulation of the present invention may be provided in the form of a formulation suitable for gravure printing, flexo printing and/or ink-jet printing. For the preparation of such formulations, ink base formulations as known from the state of the art can be used.

It is preferred that the positive tone photoresist formulation is applied in step (1) as a layer having an average thickness of about 0.1 to 50 μm, more preferably of about 0.5 to 20 μm, and most preferably of about 1 to 5 μm. The desired layer thickness can be obtained by applying positive tone photoresist formulations with various concentrations by either single or multiple application.

It is preferred that the positive tone photoresist formulation, which is applied in step (1) to a surface of a substrate, is solidified by a pre-baking treatment. Such pre-baking is preferred to solidify the positive tone photoresist formulation on the substrate. The pre-baking treatment can be performed at a temperature of 70 to 150° C., preferably at a temperature of 90 to 130° C. The time of the pre-baking treatment is preferred to be between 10 to 180 seconds, more preferably 30 to 90 seconds in the case of hot plate, and preferred for 1 to 10 minutes, more preferred 1 to 5 min in the case of an oven. It is particularly preferred to include a step of removing excessive solvent by spinning or vacuum prior to the pre-baking treatment.

It is preferred that the photopatterning in step (2) is carried out by (2a) irradiating the applied positive tone photoresist formulation with light having a specific wavelength through a mask, and (2b) developing the irradiated positive tone photoresist formulation by exposing it to a developer and washing liquid to obtain a photopatterned structure.

It is preferred that irradiation with light having a specific wavelength in step (2a) involves exposure to UV and/or violet light. Typically, any type of light source conventionally used in pattern forming processes can be used. Such a light source includes a high-pressure mercury lamp, a low-pressure mercury lamp, a lamp of metal halide, xenon or the like, laser diode, LED, and the like. As UV light, ultraviolet ray such as g-line, h-line and i-line is usually used. Except for ultra-fine processing such as for semiconductor, it is general to use light (high-pressure mercury lamp) of 360 to 430 nm for the pattern of from several μm to several tens μm. Above all, in the case of liquid crystal display devices, light of 430 nm is often used. Although the energy of the irradiation light depends on the light source or thickness of the positive photoresist layer, it is preferably in the range from 20 to 2,000 mJ/cm$^2$, preferably 50 to 1,000 mJ/cm$^2$.

In order to irradiate the light in a pattern, common photomasks can be used. Such photomasks can be freely selected from known ones. Although the environment at the time of irradiation is not particularly limited, it may be, in general, an ambient atmosphere (in the air) or nitrogen atmosphere. Further, in the case of forming a film on the entire surface of the substrate, the light can be irradiated on the entire surface of the substrate. In the present invention, the patterned structure also includes the case where a structure is formed on the entire surface of the substrate.

As the developer to be used for the development, any developer commonly applied for the development of conventional known photosensitive siloxane composition may be used. Preferred developers include alkali developers that are aqueous solutions of an alkaline compound such as tetraalkyl ammonium hydroxide, choline, alkali metal hydroxide, alkali metal metasilicate (hydrate), alkali metal phosphate (hydrate), ammonia, alkylamine, alkanolamine and heterocyclic amine, and particularly preferred alkali developer is aqueous TMAH solution. These alkaline developers may optionally further contain a water-soluble organic solvent such as methanol and ethanol, or a surfactant. The developing method can also be freely selected from conventionally known methods. Typically, it includes methods such as immersion in a developer (dip), paddle, shower, slit, cap coat, and spray. A pattern can be obtained by this development. After the development is performed by a developer, it is preferable that water rinsing is performed.

It is preferred that the curing in step (3) is carried out by (3a) exposing the photopatterned structure to a UV light irradiation (i.e. flood exposure), and (3b) subjecting it to a thermal post-baking treatment to obtain a cured photopatterned dielectric material on the surface of the substrate.

When using positive tone photoresist formulations to form transparent coatings, it is necessary to irradiate with light, which is called bleaching or flood exposure (3a). By performing flood exposure, unreacted diazonaphthoquinone derivative, which remained in the film, is decomposed by light and optical transparency of the film is further improved. In the bleaching exposure method, using high-pressure mercury lamp, a low-pressure mercury lamp and the like, about 10 to 2,000 mJ/cm$^2$ of exposure irradiation intensity is applied on the entire surface.

It is preferred that the thermal post-baking treatment in step (3b) involves exposure to heat. The curing temperature of the structure is not particularly limited and can be freely selected as long as dehydration condensation of the siloxane polymer proceeds. When the curing temperature is too low, the reaction does not proceed sufficiently and silanol groups remain in the film, which may adversely affect the performance of the coating. Therefore it is more preferable that the thermal post-baking treatment involves exposure to an elevated temperature, preferably in the range from 100 to 300° C., more preferably from 150 to 250° C., and most preferably from 180 to 230° C.

In general, when the developed pattern is heated to cure, the pattern often changes in shape. Specifically, the developed pattern generally has a rectangular section and the side wall thereof stands almost straight upright. However, when the pattern is heated, the coated material is temporarily softened, and the sectional shape of the pattern tends to change from a rectangle to a trapezoid. As a result, the inclined angle of the side wall, namely, the taper angle tends to be decreased and the sectional bottom width of the pattern, namely, the line width tends to be increased by heating.

In contrast, by using the positive tone photoresist formulation according to the present invention, the decrease in taper angle, due to a flow of the softened material, can be inhibited to obtain comparable taper angles after the post-baking (3a) as after the development step (2b). This is presumed to be because of the crosslinking of the siloxane in step (2a).

Electronic Device

In a third aspect, the present invention provides an electronic device, preferably a packaged microelectronic device, a FET array panel or a TFT array panel, which comprises a microelectronic structure, obtainable by the method for manufacturing a microelectronic structure according to the present invention.

For the electronic device, it is preferred that the cured photopatterned dielectric material obtained from the positive tone photoresist formulation passivates and optionally planarizes the surface of the substrate, which forms part of the microelectronic structure. The cured photopatterned dielectric material forms a dielectric layer, which serves to electrically separate one or more electronic components of the electronic device from each other.

The present invention is further illustrated by the examples following herein after, which shall in no way be construed as limiting. The skilled person will acknowledge that various modifications, additions and alternations may be made to the invention without departing from the spirit and scope of the invention as defined in the appended claims.

EXAMPLES

Measurement Methods

NMR Spectroscopy: NMR samples were measured in 3.7 mm ($Ø_A$) FEP inliner placed inside a 5 mm ($Ø_A$) thin-walled precision glass NMR tube (Wilmad 537 PPT), which contained CD$_3$CN in the annular space, or internally as dry solvent in 5 mm ($Ø_A$) precision glass NMR tubes. The measurements were carried out at 25° C. on a Bruker Avance III 400 MHz spectrometer equipped with a 9.3980 T cryomagnet. The $^1$H NMR spectra were acquired using a 5 mm combination $^1$H/$^{19}$F probe operating at 400.17 and 376.54 MHz, respectively. The $^{13}$C, and $^{29}$Si NMR spectra were obtained using a 5 mm broad-band inverse probe operating at 100.62 and 79.50 MHz, respectively. Line-broadening parameters used in exponential multiplication of the free induction decays were set equal to or less than their respective data-point resolutions or the natural line widths of the resonances. All line-shape functions were Lorentzian unless specified otherwise. In some cases, the free induction decays were multiplied by Gaussian functions for resolution enhancement on Fourier transformation. The $^1$H NMR chemical shifts were referenced with respect to tetramethylsilane (TMS) yielding the following chemical shifts for the used solvents CDCl$_3$ (7.23 ppm), DMSO-d6 (2.50 ppm) and CD$_2$HCN (1.96 ppm). The $^{13}$C NMR spectra were referenced with respect to tetramethylsilane (TMS) using the chemical shifts for the solvents CDCl₃ (77.2 ppm), DMSO-d6 (39.5 ppm) and CD₃CN (118.7 ppm). The $^{29}$Si NMR chemical shifts were referenced with respect to SiCl₄. A positive (negative) sign denotes a chemical shift to high (low) frequency of the reference compound.

GPC analysis: Gel permeation chromatographic (GPC) analysis was carried out on an Waters e2695 liquid chromatography system equipped with a refractive index detector. The column was eluted with tetrahydrofuran at a flow rate of 0.6 cm³/min and temperature of 40° C. A series of 6 narrow-dispersity polystyrene standards was used to calibrate the GPC system.

Photopatterning: The dried coating film was exposed to light in a NES2 W-ghi06 stepper (Nikon Engineering Co., Ltd.; Nikon Precicion inc.) in a line-and-space and hole pattern shape (4 μm line, 12 μm space) with 100 to 200 mJ/cm² by means of broadband illumination to accommodate ghi-line resist processing. The stepper employs 365-436 nm exposure wavelength to deliver resolution below 2.3 μm, with champion performance down to 1.7 μm and the overlay accuracy is 0.35 μm on a wafer size of 150-200 mm.

UV Lamps to entire surface exposure 1: There is a method for exposing light over the entire surface with about 100 to 2000 mJ/cm² (in terms of exposure amount at wavelength of 365 nm) using an ultraviolet visible exposure machine such as the Canon Mask aligner Model PLA-501F.

UV Lamps to entire surface exposure 2: There is a method for exposing light over the entire surface with about 50 to 100 mJ/cm² (in terms of exposure amount at wavelength of 230 nm) using an ultraviolet visible exposure machine (for example, Ushio).

Synthesis of Monomers

1-Allyl-3,4-di methyl-pyrrole-2,5-dione

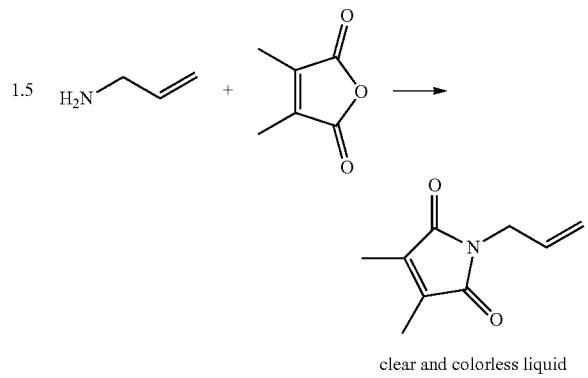

clear and colorless liquid

In a 250-mL round bottom flask equipped with a Dean Stark trap 3,4-dimethyl-furan-2,5-dione (160.0 g; 1243.4 mmol; 1.0 eq.) was dissolved in anhydrous toluene (1040 mL; 9.8 mol; 7.90 eq.). The mixture was stirred at RT until completely dissolved. A solution of allyl amine (139.9 ml; 1865.0 mmol; 1.5 eq.) in anhydrous toluene (160.0 ml; 1.5 mol; 1.2 eq.) was added by means of a dropping funnel at 23° C. The solution was warmed (140° C., reflux) and stirred for 5 hours at 140° C. With time a white solid precipitated. The mixture was subsequently cooled to RT and toluene removed in vacuum (10 mbar) at 70° C. Liquid, clear and pale orange crude product (222 g) was isolated. After fractional condensation in vacuum (10⁻² mbar) at 120° C. clear and colorless product, 1-allyl)-3,4-dimethyl-pyrrole-2,5-dione (201.2 g; 1.169 mmol) was isolated in 94% yield and 96% purity. The product was stored at low temperature (4° C.).

¹H-NMR (400.17 MHz, DMSO, δ in ppm): 1.92 (s, 6H, CH₃); 4.01 (dt, $^3J_{HH}$=5.1 Hz, $^4J_{HH}$=1.7, 2H, CH₂); 5.05 (ddt, $^3J_{trans-HH}$=17.1 Hz, $^2J_{HH}$=3.1 Hz, $^4J_{HH}$=1.5 Hz, 1H, CH₂=CH); 5.08 (ddt, $^3J_{cis-HH}$=10.3 Hz, $^2J_{HH}$=3.1 Hz, $^4J_{HH}$=1.5 Hz, 1H, CH₂=CH); 5.79 (ddt, $^3J_{trans-HH}$=17.1 Hz, $^3J_{cis-HH}$=10.3 Hz, $^3J_{HH}$=5.1 Hz, 1H, CH₂=CH).

¹³C-NMR (100.62 MHz, CDCl₃, δ in ppm): 8.62 (q, $^1J_{CH}$=129.5 Hz, CH₃); 39.92 (td, $^1J_{CH}$=140.3 Hz, $^2J_{CH}$=8.0 Hz, $^2J_{CH}$=5.5 Hz, CH₂); 117.18 (ddt, $^1J_{CH}$=159.4 Hz, $^1J_{CH}$=155.3 Hz, $^3J_{CH}$=5.5 Hz, CH₂); 132.01 (dtd, $^1J_{CH}$=157.7 Hz, $^2J_{CH}$=5.5 Hz, $^2J_{CH}$=3.0 Hz, CH); 137.18 (qq, $^2J_{CH}$=7.5 Hz, $^3J_{CH}$=5.7 Hz, C≡C); 171.6 (m, C=O).

3,4-Dimethyl-1-(3-triethoxysilylpropyl)pyrrole-2,5-dione (DMMI)

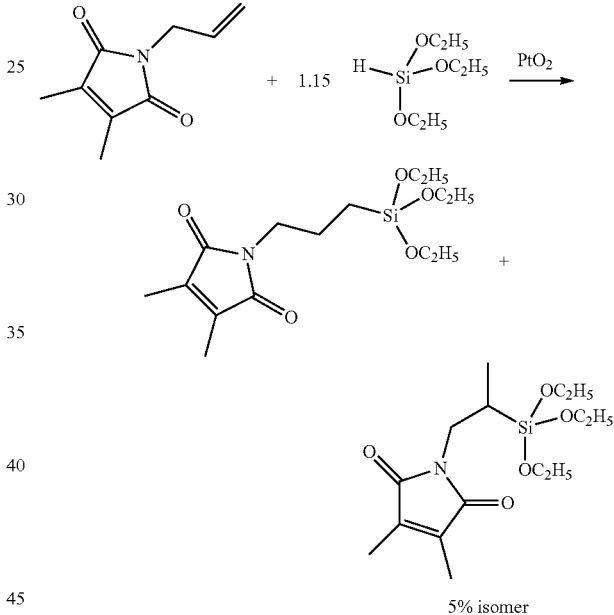

5% isomer

In a 500-mL round bottom flask equipped with a reflux-condenser pale yellow and liquid 1-allyl-3,4-dimethyl-pyrrole-2,5-dione (100.0 g; 851.2 mmol; 1.0 eq.) was presented and platinum(IV)oxide (25.0 mg; 0.110 mmol, 1.15 eq.) and triethoxysilane (129.9 g; 668.3 mmol; 1.15 eq.) were added upon rigorous stirring at RT. The solution was warmed (80° C.) and stirred for 190 h at 80° C. The completion of the reaction was monitored by ¹H NMR spectroscopy. The solution was subsequently cooled to RT. Chloroform (100 mL) and active coal (8.0 g) were added and stirred for 1 h at RT. The suspension was subsequently filtered (paper filter and 0.45 μm PTFE filter) and the mother liquor distilled in vacuum (20 mbar) at 60° C. to remove the solvents. The product 3,4-dimethyl-1-(3-triethoxysilylpropyl)pyrrole-2,5-dione (162 g) was isolated as clear and pale brown liquid. After fractional condensation in vacuum (0.2-0.35 mbar) at 130 to 140° C. clear and deep yellow material, beta 3,4-dimethyl-1-(2-triethoxysilylpropyl)pyrrole-2,5-dione (11.93 g; 36.2 mmol) was isolated in 6.2% yield and 96% purity. The desired product, gamma 3,4-dimethyl-1-(3-triethoxysilylpropyl)pyrrole-2,5-dione (147.6 g; 448 mmol) was isolated in vacuum (0.2 mbar) at 160° C. as clear and colorless liquid in 77% yield and 99% purity. The material was stored at low temperature (4° C.).

$^1$H-NMR (400.17 MHz, CD$_3$CN film, δ in ppm): −0.05 (m, 2H, CH$_2$); 0.61 (t, $^3J_{HH}$=7.0 Hz, 9H, CH$_3$); 1.04 (tt, $^3J_{HH}$=7.3 Hz, $^3J_{HH}$=resolution T$_{1/2}$=2.5 Hz, 2H, CH$_2$); 1.36 (s, 6H, CH$_3$); 2.85 (t, $^3J_{HH}$=7.3, 2H, CH$_2$); 3.21 (q, $^3J_{HH}$=7.0 Hz, 6H, CH$_2$).

$^{13}$C-NMR (100.62 MHz, CD$_3$CN film, δ in ppm): 6.69 (tt, $^1J_{CH}$=117.1 Hz, $^2J_{CH}$=2.9 Hz, CH$_2$); 6.97 (q, $^1J_{CH}$=128.9 Hz, CH$_3$); 17.08 (qt, $^1J_{CH}$=125.8 Hz, $^2J_{CH}$=2.3 Hz, CH$_3$); 21.19 (tc, $^1J_{CH}$=128.8 Hz, $^2J_{CH}$=resolution T$_{1/2}$=12 Hz, CH$_2$); 39.10 (tt, $^1J_{CH}$=139.7 Hz, $^2J_{CH}$=4.4 Hz, CH$_2$); 57.04 (tq, $^1J_{CH}$=141.8 Hz, $^2J_{CH}$=4.5 Hz, CH$_2$); 135.65 (qq, $^2J_{CH}$=7.5 Hz, $^3J_{CH}$=5.7 Hz, C=O); 170.33 (m, C=O).

29Si{$^1$H}-NMR (79.5 MHz, CDCl$_3$, δ in ppm): −46.0 (s).

Synthesis of Siloxane Polymers

Example 1—MDMMIQ-5030

Methyltrimethoxysilane (6.80 g, 50.0 mmol), tetraethyl orthosilicate (4.12 g, 20.0 mmol), 3,4-dimethyl-1-(3-triethoxysilylpropyl)pyrrole-2,5-dione (9.84 g, 30.0 mmol) and propan-2-ol (14.0 g) were charged to the reaction vessel and purged with nitrogen. Tetramethylammonium hydroxide (10.2 g, 28.0 mmol, 25% in water) was added dropwise to the reaction with rapid stirring over 5 minutes. The temperature was controlled to <25° C. during the addition. The reaction was stirred for 2 hours at 23° C. under nitrogen. The reaction mixture was poured into a rapidly stirred second flask containing deionized water (14.0 g), 35% hydrochloric acid (3.07 g, 29.4 mmol) and n-propyl acetate (50.0 g). The mixture was stirred at 23° C. for 1 hour and then the aqueous phase was removed. The organic phase was washed with deionized water (30.0 g) then concentrated in vacuo to approximately 15 cm$^3$ volume. Propan-2-ol (20 g) was added to the organic phase and the solution concentrated in vacuo to give Siloxane 1 (18.3 g, 39 wt.-% in propan-2-ol). GPC (THF, 40° C.): M$_W$=2,255 g/mol.

Example 2—MDMMIQ-5040

Methyltrimethoxysilane (6.80 g, 50.0 mmol), tetraethyl orthosilicate (2.08 g, 10.0 mmol), 3,4-dimethyl-1-(3-triethoxysilylpropyl)pyrrole-2,5-dione (13.16 g, 40.0 mmol) and propan-2-ol (14.0 g) were charged to the reaction vessel and purged with nitrogen. Tetramethylammonium hydroxide (10.9 g, 30.0 mmol, 25% in water) was added dropwise to the reaction with rapid stirring over 5 minutes. The temperature was controlled to <25° C. during the addition. The reaction was stirred for 2 hours at 23° C. under nitrogen. The reaction mixture was poured into a rapidly stirred second flask containing deionized water (14.0 g), 35% hydrochloric acid (3.29 g, 31.5 mmol) and n-propyl acetate (50.0 g). The mixture was stirred at 23° C. for 1 hour and then the aqueous phase was removed. The organic phase was washed with deionized water (30.0 g) then concentrated in vacuo to approximately 15 cm$^3$ volume. Propan-2-ol (20 g) was added to the organic phase and the solution concentrated in vacuo to give Siloxane 2 (22.7 g, 39 wt.-% in propan-2-ol). GPC (THF, 40° C.): M$_W$=1,614 g/mol.

Example 3—MDMMIQ-6010

Methyltrimethoxysilane (8.16 g, 60.0 mmol), tetraethyl orthosilicate (6.24 g, 30.0 mmol), 3,4-dimethyl-1-(3-triethoxysilylpropyl)pyrrole-2,5-dione (3.29 g, 10.0 mmol) and propan-2-ol (14.0 g) were charged to the reaction vessel and purged with nitrogen. Tetramethylammonium hydroxide (5.21 g, 14.3 mmol, 25% in water) was added dropwise to the reaction with rapid stirring over 5 minutes. The temperature was controlled to <25° C. during the addition. The reaction was stirred for 2 hours at 23° C. under nitrogen. The reaction mixture was poured into a rapidly stirred second flask containing deionized water (14.0 g), 35% hydrochloric acid (1.57 g, 15.0 mmol) and n-propyl acetate (50.0 g). The mixture was stirred at 23° C. for 1 hour and then the aqueous phase was removed. The organic phase was washed with deionized water (30.0 g) then concentrated in vacuo to approximately 15 cm$^3$ volume. Propan-2-ol (20 g) was added to the organic phase and the solution concentrated in vacuo to give Siloxane 3 (15.5 g, 39 wt.-% in propan-2-ol). GPC (THF, 40° C.): M$_W$=6,160 g/mol.

Example 4—MDMMIQ-8010

Methyltrimethoxysilane (10.9 g, 80.0 mmol), tetraethyl orthosilicate (2.08 g, 10.0 mmol), 3,4-dimethyl-1-(3-triethoxysilylpropyl)pyrrole-2,5-dione (3.29 g, 10.0 mmol) and propan-2-ol (14.0 g) were charged to the reaction vessel and purged with nitrogen. Tetramethylammonium hydroxide (11.0 g, 30 mmol, 25% in water) was added dropwise to the reaction with rapid stirring over 5 minutes. The temperature was controlled to <25° C. during the addition. The reaction was stirred for 2 hours at 23° C. under nitrogen. The reaction mixture was poured into a rapidly stirred second flask containing deionized water (14.0 g), 35% hydrochloric acid (3.29 g, 31.5 mmol) and n-propyl acetate (50.0 g). The mixture was stirred at 23° C. for 1 hour and then the aqueous phase was removed. The organic phase was washed with deionized water (30.0 g) then concentrated in vacuo to approximately 15 cm$^3$ volume. Propan-2-ol (20 g) was added to the organic phase and the solution concentrated in vacuo to give Siloxane 4 (14.5 g, 39 wt.-% in propan-2-ol). GPC (THF, 40° C.): M$_W$=1,986 g/mol.

Example 5—MPDMMIQ-502010

Methyltrimethoxysilane (6.80 g, 50.0 mmol), phenyltrimethoxysilane (3.96 g, 20.0 mmol), tetraethyl orthosilicate (4.16 g, 20.0 mmol), 3,4-dimethyl-1-(3-triethoxysilylpropyl)pyrrole-2,5-dione (3.29 g, 10.0 mmol) and propan-2-ol (14.0 g) were charged to the reaction vessel and purged with nitrogen. Tetramethylammonium hydroxide (10.9 g, 30.0 mmol, 25% in water) was added dropwise to the reaction with rapid stirring over 5 minutes. The temperature was controlled to <25° C. during the addition. The reaction was stirred for 2 hours at 23° C. under nitrogen. The reaction mixture was poured into a rapidly stirred second flask containing deionized water (14.0 g), 35% hydrochloric acid (3.29 g, 31.5 mmol) and n-propyl acetate (50.0 g). The mixture was stirred at 23° C. for 1 hour and then the aqueous phase was removed. The organic phase was washed with deionized water (30.0 g) then concentrated in vacuo to approximately 15 cm$^3$ volume. Propan-2-ol (20 g) was added to the organic phase and the solution concentrated in vacuo to give Siloxane 5 (20.5 g, 39 wt.-% in propan-2-ol). GPC (THF, 40° C.): M$_W$=2,033 g/mol.

Example 6—MPDMMIQ-503010

Methyltrimethoxysilane (6.80 g, 50.0 mmol), tetraethyl orthosilicate (2.08 g, 10.0 mmol), phenyltrimethoxysilane (5.95 g, 30.0 mmol), 3,4-dimethyl-1-(3-triethoxysilylpropyl)pyrrole-2,5-dione (3.29 g, 10.0 mmol) and propan-2-ol (14.0 g) were charged to the reaction vessel and purged with nitrogen. Tetramethylammonium hydroxide (10.9 g, 30.0 mmol, 25% in water) was added dropwise to the reaction with rapid stirring over 5 minutes. The temperature was controlled to <25° C. during the addition. The reaction was stirred for 2 hours at 23° C. under nitrogen. The reaction mixture was poured into a rapidly stirred second flask containing deionized water (14.0 g), 35% hydrochloric acid (3.31 g, 31.5 mmol) and n-propyl acetate (50.0 g). The mixture was stirred at 23° C. for 1 hour and then the aqueous phase was removed. The organic phase was washed with deionized water (30.0 g) then concentrated in vacuo to approximately 15 cm3 volume. propanPropan-2-ol (20 g) was added to the organic phase and the solution concentrated in vacuo to give Siloxane 6 (15.7 g, 39 wt.-% in propan-2-ol). GPC (THF, 40° C.): $M_W$=1,899 g/mol.

Example 7—MPDMMI-504010

Methyltrimethoxysilane (6.80 g, 50.0 mmol), phenyltrimethoxysilane (7.92 g, 40.0 mmol), 3,4-dimethyl-1-(3-triethoxysilylpropyl)pyrrole-2,5-dione (3.29 g, 10.0 mmol) and propan-2-ol (14.0 g) were charged to the reaction vessel and purged with nitrogen. Tetramethylammonium hydroxide (10.9 g, 30.0 mmol, 25% in water) was added dropwise to the reaction with rapid stirring over 5 minutes. The temperature was controlled to <25° C. during the addition. The reaction was stirred for 2 hours at 23° C. under nitrogen. The reaction mixture was poured into a rapidly stirred second flask containing deionized water (14.0 g), 35% hydrochloric acid (3.29 g, 31.5 mmol) and n-propyl acetate (50.0 g). The mixture was stirred at 23° C. for 1 hour and then the aqueous phase was removed. The organic phase was washed with deionized water (30.0 g) then concentrated in vacuo to approximately 15 cm$^3$ volume. Propan-2-ol (20 g) was added to the organic phase and the solution concentrated in vacuo to give Siloxane 7 (23.1 g, 39 wt.-% in propan-2-ol). GPC (THF, 40° C.): $M_W$=1,626 g/mol.

Example 8—MDMMIBe-503020

Methyltrimethoxysilane (6.80 g, 50.0 mmol), 1,2-bis(triethoxysilyl)ethane (7.09 g, 20.0 mmol), 3,4-dimethyl-1-(3-triethoxysilylpropyl)pyrrole-2,5-dione (9.84 g, 30.0 mmol) and propan-2-ol (14.0 g) were charged to the reaction vessel and purged with nitrogen. Tetramethylammonium hydroxide (7.64 g, 21.0 mmol, 25% in water) was added dropwise to the reaction with rapid stirring over 5 minutes. The temperature was controlled to <25° C. during the addition. The reaction was stirred for 2 hours at 23° C. under nitrogen. The reaction mixture was poured into a rapidly stirred second flask containing deionized water (14.0 g), 35% hydrochloric acid (2.30 g, 22.1 mmol) and n propyl acetate (50.0 g). The mixture was stirred at 23° C. for 1 hour and then the aqueous phase was removed. The organic phase was washed with deionized water (30.0 g) then concentrated in vacuo to approximately 15 cm$^3$ volume. propan-2-ol (20 g) was added to the organic phase and the solution concentrated in vacuo to give Siloxane 8 (29.2 g, 39 wt.-% in propan-2-ol). GPC (THF, 40° C.): $M_W$=3,182 g/mol.

Example 9—MPQ-5040-HA: (Reference)

Methyltrimethoxysilane (6.80 g, 50.0 mmol), phenyltrimethoxysilane (7.92 g, 40.0 mmol), tetraethyl orthosilicate (2.08 g, 10.0 mmol) and propan-2-ol (28.0 g) were charged to the reaction vessel and purged with nitrogen. Tetramethylammonium hydroxide (11.8 g, 32.4 mmol, 25% in water) was added drop-wise to the reaction with rapid stirring over 5 minutes. The temperature was controlled to <25° C. during the addition. The reaction was stirred for 2 hours at 23° C. under nitrogen. The reaction mixture was poured into a rapidly stirred second flask containing deionized water (34.0 g), 35% hydrochloric acid (3.54 g, 34.0 mmol) and n-propyl acetate (34.0 g). The mixture was stirred at 23° C. for 1 hour and then the aqueous phase was removed. The organic phase was washed with deionized water (30.0 g) then concentrated in vacuo to approximately 15 cm$^3$ volume. propan-2-ol (20 g) was added to the organic phase and the solution concentrated in vacuo to give Siloxane 9 (23.0 g, 39 wt.-% in propan-2-ol). GPC (THF, 40° C.): $M_W$=1,322 g/mol.

Example 10—MPQ-5040-LA: (Reference)

Methyltrimethoxysilane (6.80 g, 50.0 mmol), phenyltrimethoxysilane (7.92 g, 40.0 mmol), tetraethyl orthosilicate (2.08 g, 10.0 mmol) and propan-2-ol (28.0 g) were charged to the reaction vessel and purged with nitrogen. Tetramethylammonium hydroxide (8.22 g, 22.6 mmol, 25% in water) was added drop-wise to the reaction with rapid stirring over 5 minutes. The temperature was controlled to <25° C. during the addition. The reaction was stirred for 2 hours at 23° C. under nitrogen. The reaction mixture was poured into a rapidly stirred second flask containing deionized water (34.0 g), 35% hydrochloric acid (2.48 g, 23.7 mmol) and n-propyl acetate (34.0 g). The mixture was stirred at 23° C. for 1 hour and then the aqueous phase was removed. The organic phase was washed with deionized water (30.0 g) then concentrated in vacuo to approximately 15 cm$^3$ volume. propan-2-ol (20 g) was added to the organic phase and the solution concentrated in vacuo to give Siloxane 10 (23.0 g, 39 wt.-% in propan-2-ol). GPC (THF, 40° C.): $M_W$=2,262 g/mol.

Photopatterning and Performance

Photopatterning

Substrates (glass or Si wafer) were washed as per a standard process of sequential ultra-sonication each in acetone and isopropyl alcohol for 10 minutes. Each positive tone photoresist formulation (20 to 40% total solid content) was applied on either a 4-inch silicon wafer or a glass substrate by means of spin coating (1,000 to 2,000 rpm) to yield a uniform film with a target thickness of 1 to 3 μm. The obtained film was pre-baked for 90 seconds at 100° C. to evaporate the solvent (process step (1)). The dried coating film was exposed to light in a line-and-space and hole pattern shape (4 μm line, 12 μm space) with 100 to 500 mJ/cm$^2$ by means of broadband illumination to accommodate ghi-line (wavelength: 365 to 436 nm) resist processing (process step (2a)). Subsequently, subjected to puddle development for 120 seconds using 2.38% TMAH aqueous solution and further rinsed with pure water for 60 seconds (process step (2b)). After dried, the taper angle of the developed pattern was measured with a scanning electron microscope (SEM). Further, the developed pattern was subjected to flood exposure with 1,000 mJ/cm$^2$ by means of either a g+h+i lines mask aligner or 100 mJ/cm$^2$ by means of a UV lamp at 230 nm, and then heated to cure in air or nitrogen at 250° C. for 30 minutes. The cured pattern was observed with a scanning electron microscope (SEM) to measure the taper angle thereof. Meanwhile, the line width of the pattern was observed with a SEM after the development and additionally after the post-baking step, to measure the linewidth increasing ratio.

Adhesion on Glass

The cured pattern (see photopatterning) was cut into smaller pieces together with the substrate, and the plastic stud and the cured film were bonded via an epoxy resin layer. Next, the stud was pulled, and the load at peeling was measured with a thin film adhesion strength measuring machine, namely Romulus manufactured by Quad Group.

Photoresist Formulations with Photoacid Generator (PAG)

Examples 101 to 106 and Reference 100: Positive tone photoresist formulations comprising a photoacid generator (PAG) were prepared according to the compositions shown in Table 1. The amounts given in the table are with reference to part by mass and indicated as parts per hundred (phr).

Photoactive agent: 4,4'-(1-(4-(1-(4-Hydroxy-phenyl)-1-methylethyl)phenyl) ethylidene)bisphenol modified with 2.0 mole of naphthoquinone diazide sulfonic acid.
Photoacid generator: 1,8-Naphthalimidyl triflate (NAI-105 by Midori Kagaku Co., Ltd.).
Surfactant: Diphenyl dimethylsiloxane (KF-53 by Shin-Etsu Chemical Co., Ltd.).

TABLE 1

Composition and evaluation of Examples 101 to 106 and Reference 100.

| | Example | | | | | | Ref. |
|---|---|---|---|---|---|---|---|
| | 101 | 102 | 103 | 104 | 105 | 106 | 100 |
| Siloxane 1 (MDMMIQ-5030) | 50 | — | — | — | — | — | — |
| Siloxane 2 (MDMMIQ-5040) | — | — | — | — | 50 | — | — |
| Siloxane 3 (MDMMIQ-6010) | — | — | 50 | — | — | — | — |
| Siloxane 4 (MDMMIQ-8010) | — | — | — | — | — | 50 | — |
| Siloxane 5 (MPDMMIQ-502010) | — | 50 | — | — | — | — | — |
| Siloxane 7 (MPDMMI-504010) | — | — | — | 50 | — | — | — |
| MPQ-5040-HA/LA | 50 | 50 | 50 | 50 | 50 | 50 | 100 |
| photoactive agent | 8 | 8 | 8 | 8 | 8 | 8 | 8 |
| photoacid generator | 1 | 1 | 1 | 1 | 1 | 1 | 1 |
| surfactant | 0.1 | 0.1 | 0.1 | 0.1 | 0.1 | 0.1 | 0.1 |
| maleic acid | 0.5 | — | — | — | 0.5 | — | — |
| energy [mJ/cm$^2$] | 191 | 220 | 169 | 104 | 234 | Peering | 133 |
| 1000 mJ (g, h, i-line) taper angle [°] | 63 | 40 | 69 | NM | 37 | | 71 |
| pattern shape | OK | OK | OK | Flow | OK | | OK |
| 100 mJ (230 nm) taper angle [°] | 84 | 68 | NM | NM | 78 | | 75 |
| pattern shape | OK | OK | ND | ND | OK | | OK |
| adhesion on glass [MPa] | 29 | — | — | 34 | — | | 21 |

NM: not measured; ND: not defined.

As can be seen from the experimental results in Table 1, the flow behavior is suppressed by an increasing amount of the first and/or third repeating unit in the siloxane polymer (see Example 101 comprising Siloxane 1 (MDMMIQ-5030) being prepared with 20 parts tetraethyl orthosilicate (TEOS); Example 104 comprising Siloxane 7 (MPDMMI 504010) being prepared without tetraethyl orthosilicate (TEOS); and Reference 100 (MPQ-5040-HA/LA)). TEOS (third repeating unit) crosslinks at relatively low temperatures (<120° C.) so that the photoresist formulation crosslinks faster than flow can occur. However, an increasing amount of TEOS results in a more rigid and brittle film, which reduces cracking threshold of the photoresist coating after curing. The DMMI containing repeating unit (first repeating unit) can be crosslinked by UV light in the flood exposure process step, so that the obtained pattern is structurally fixed.

Figure 2A:
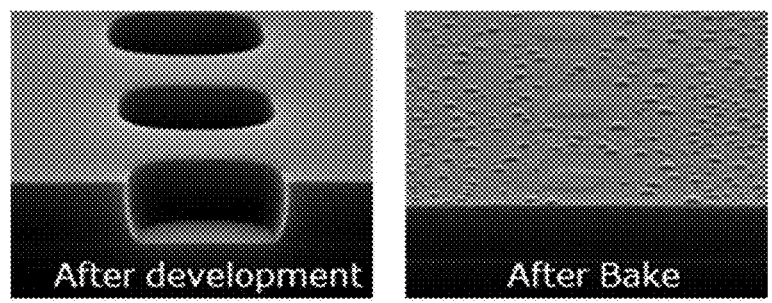
FIG. 2a: Photopatterning of photoresist formulation of Reference 100. Left side: after development. Right side: after post-baking.

FIG. 2a shows the photoresist formulation of Reference 100 (MPQ-5040-HA/LA standard formulation) after development and after post-baking.

Figure 2B:
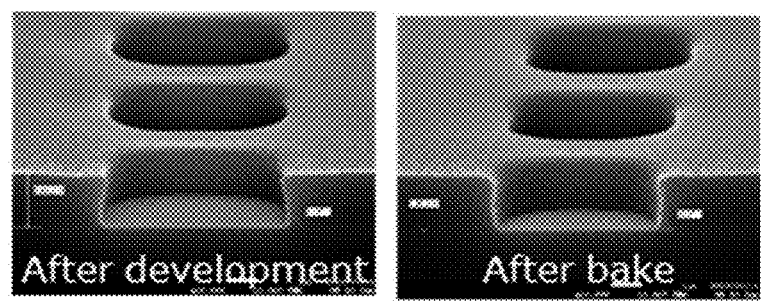
FIG. 2b: Photopatterning of photoresist formulation of Example 101. Left side: after development. Right side: after post-baking.

FIG. 2b shows the photoresist formulation of Example 101 after development and after post-baking.

The new DMMI containing siloxane polymer in the photoresist formulation of Example 101 provides an excellent pattern, whereas the MPQ siloxane polymer in the photoresist formulation of Reference 100 deliquesces.

Moreover, it is found that photoresist formulations according to the present invention show an improved adhesion on the substrate (see Example 104 comprising Siloxane 7 (MPDMMI-504010) (34 MPas); and Reference 100 (MPQ-5040-HA/LA) (21 MPas)).

Improved Photosensitivity

Example 107 and Reference 101: Positive tone photoresist formulations were prepared according to the compositions shown in Table 2. The amounts given in the table are with reference to part by mass and indicated as parts per hundred (phr).

Photoactive agent: 4,4'-(1-(4-(1-(4-Hydroxy-phenyl)-1-methylethyl)phenyl) ethylidene)bisphenol modified with 2.0 mole of naphthoquinone diazide sulfonic acid.
Photoacid generator: 1,8-Naphthalimidyl triflate (NAM 05 by Midori Kagaku Co., Ltd.).
Surfactant: Diphenyl dimethylsiloxane (KF-53 by Shin-Etsu Chemical Co., Ltd.).

TABLE 2

Composition and evaluation of Example 107 and Reference 101.

| | Example 107 | Reference 101 |
|---|---|---|
| Siloxane 5 (MPDMMIQ-502010) | 50 | — |
| MPQ-5040-HA/LA | 50 | 100 |
| photoactive agent | 8 | 8 |
| photoacid generator | 1 | 1 |
| surfactant | 0.1 | 0.1 |
| maleic acid | — | — |
| energy [mJ/cm$^2$] | 10 | 133 |
| after development taper angle [°] | 67 | 72 |

Furthermore, the new DMMI containing siloxane polymer provides a higher photosensitivity when compared to standard MPQ siloxane polymer (see Example 102 comprising Siloxane 5 (MPDMMIQ-502010) (10 mJ/cm$^2$); and Reference 101 (MPQ-5040-HA/LA) (133 mJ/cm$^2$)).

Photosensitivity or light power time are of great importance because they improve the tact time of the exposure. Formulations with higher photosensitivity require shorter exposure times and are particularly suitable for thick film applications. They have a positive influence on the so-called taper angle and pattern shape. If development speed between exposed and unexposed area is high, a more vertical pattern can be obtained, whereas slow development speed provides decreased film thickness and a taped pattern. The positive tone photoresist formulations of the present invention offers various possibilities to change or modify the shape and contrast of the obtained photopattern.

Photoresist Formulations without Photoacid Generator (PAG)

Examples 201 to 205 and Reference 200: Positive tone photoresist formulations comprising no photoacid generator were prepared according to the compositions shown in Table 3. The amounts given in the table are with reference to part by mass and indicated as parts per hundred (phr).

Photoactive agent: 4,4'-(1-(4-(1-(4-Hydroxy-phenyl)-1-methylethyl)phenyl) ethylidene)bisphenol modified with 2.0 mole of naphthoquinone diazide sulfonic acid.

Surfactant: Diphenyl dimethylsiloxane (KF-53 by Shin-Etsu Chemical Co., Ltd.).

TABLE 3

Composition and evaluation of Examples 201 to 205 and Reference 200.

| | Example | | | | | Ref. |
|---|---|---|---|---|---|---|
| | 201 | 202 | 203 | 204 | 205 | 200 |
| Example 1 (MDMMIQ-5030) | 50 | — | 100 | — | — | — |
| Example 2 (MDMMIQ-5040) | — | — | — | — | 50 | — |
| Example 8 (MDMMIBe-503020) | — | 50 | — | 100 | — | — |
| MPQ-5040-HA/LA | 50 | 50 | — | — | 50 | 100 |
| photoactive agent | 8 | 8 | 8 | 8 | 8 | 8 |
| photoacid generator | No | No | No | No | No | No |
| surfactant | 0.1 | 0.1 | 0.1 | 0.1 | 0.1 | 0.1 |
| maleic acid | 0.5 | 0.3 | 0.05 | 0.05 | 0.5 | — |
| energy [mJ/cm²] | 212 | 176 | 283 | remaining film | 176 | 112 |
| after development taper angle [°] | 63 | 70 | 68 | | 29 | |
| pattern shape | OK | OK | OK | | OK | Flow |
| 1000 mJ (g, h, i-line) taper angle [°] | 72 | 71 | 71 | | 78 | |
| pattern shape | OK | OK | OK | | OK | Flow |

The experimental results in Table 3 show that—even without the addition of a photoacid generator (PAG)-the positive tone photoresist formulations according to the present invention exhibit excellent performance. The photoresist formulation of Example 204 is very reactive due to the presence of a repeating unit derived from 1,2-bis(triethoxysilyl)ethane in the siloxane polymer (third repeating unit).

The invention claimed is:

1. A positive tone photoresist formulation comprising:
   (a) a siloxane polymer comprising a first repeating unit and a second repeating unit; and
   (b) a photoactive dissolution modulator;
   wherein the first repeating unit contains at least one maleimide group; and the second repeating unit does not contain a maleimide group.

2. The positive tone photoresist formulation according to claim 1, wherein the first repeating unit is derived from a first siloxane monomer represented by the following Formula (1):

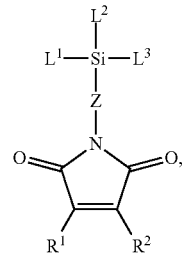

Formula (1)

wherein:
$L^1$, $L^2$ and $L^3$ are the same or different from each other and each independently is selected from R, OR, and halogen, wherein at least one of $L^1$, $L^2$ and $L^3$ is OR or halogen;

R is selected from the group consisting of H, straight-chain alkyl having 1 to 30 carbon atoms, branched-chain alkyl having 3 to 30 carbon atoms, cyclic alkyl having 3 to 30 carbon atoms, and aryl having 6 to 20 carbon atoms, wherein one or more non-adjacent and non-terminal $CH_2$ groups are optionally replaced by —O—, —S—, —C(=O)—, —C(=S)—, —C(=O)—O—, —O—C(=O)—, —NR$^0$—, —SiR$^0$R$^{00}$—, —CF$_2$—, —CR$^0$=CR$^{00}$—, —CY$^1$=CY$^2$— or —C≡C—, and wherein one or more H atoms are optionally replaced by F;

$R^1$ and $R^2$ are the same or different from each other and each independently is selected from H, alkyl having 1 to 20 carbon atoms, cycloalkyl having 3 to 20 carbon atoms and aryl having 6 to 20 carbon atoms, wherein one or more H atoms are optionally replaced by F, or $R^1$ and $R^2$ together form a mono- or polycyclic organic ring system, wherein one or more H atoms are optionally replaced by F;

Z denotes a straight-chain alkylene group having 1 to 20 carbon atoms, a branched-chain alkylene group having 3 to 20 carbon atoms or a cyclic alkylene group having 3 to 20 carbon atoms, in which one or more non-adjacent and non-terminal $CH_2$ groups are optionally replaced by —O—, —S—, —C(=O)—, —C(=S)—, —C(=O)—O—, —O—C(=O)—, —NR$^0$—, —SiR$^0$R$^{00}$—, —CF$_2$—, —CR$^0$=CR$^{00}$—, —CY$^1$=CY$^2$— or —C≡C—, and in which one or more H atoms are optionally replaced by F;

$Y^1$ and $Y^2$ are the same or different from each other and each independently is selected from H, F, Cl and CN;

$R^0$ and $R^{00}$ are the same or different from each other and each independently is selected from H, straight-chain alkyl having 1 to 20 carbon atoms and branched-chain alkyl having 3 to 20 carbon atoms which are optionally fluorinated; and wherein the second siloxane monomer is different from the first siloxane monomer.

3. The positive tone photoresist formulation according to claim 2, wherein one of the conditions (1) or (2) applies:
   (1) $L^1$=$L^2$=$L^3$=OR; or
   (2) $L^1$=$L^2$≡R, and $L^3$=Cl.

4. The positive tone photoresist formulation according to claim 2,
   wherein $R^1$ and $R^2$ are the same or different from each other and each independently is selected from H, alkyl having 1 to 12 carbon atoms, cycloalkyl having 3 to 12 carbon atoms and aryl having 6 to 14 carbon atoms, wherein one or more H atoms are optionally replaced by F, or R¹ and R² together form a mono- or polycyclic aliphatic ring system, a mono- or polycyclic aromatic ring system or a polycyclic aliphatic and aromatic ring system, wherein one or more H atoms are optionally replaced by F.

5. The positive tone photoresist formulation according to claim 1,
wherein the second repeating unit is derived from a second siloxane monomer represented by one of the following Structures S1 or S2:

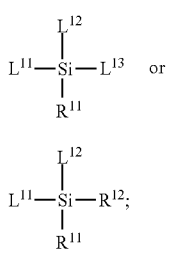

wherein:
$L^{11}$, $L^{12}$, and $L^{13}$ are the same or different from each other and each independently is selected from OR' and halogen;
R' is selected from the group consisting of straight-chain alkyl having 1 to 30 carbon atoms, branched-chain alkyl having 3 to 30 carbon atoms, cyclic alkyl having 3 to 30 carbon atoms, and aryl having 6 to 20 carbon atoms, wherein one or more non-adjacent and non-terminal $CH_2$ groups are optionally replaced by —O—, —S—, —C(=O)—, —C(=S)—, —C(=O)—O—, —O—C(=O)—, —NR⁰—, —SiR⁰R⁰⁰—, —CF₂—, —CR⁰=CR⁰⁰—, —CY¹=CY²— or —C≡C—, and wherein one or more H atoms are optionally replaced by F;
$R^{11}$, and $R^{12}$ are the same or different from each other and each independently is selected from the group consisting of H, straight-chain alkyl having 1 to 30 carbon atoms, branched-chain alkyl having 3 to 30 carbon atoms, cyclic alkyl having 3 to 30 carbon atoms, and aryl having 6 to 20 carbon atoms, which optionally contain one or more functional groups selected from —O—, —S—, —C(=O)—, —C(=S)—, —C(=O)—O—, —O—C(=O)—, —NR⁰—, —SiR⁰R⁰⁰—, —CF₂—, —CR⁰=CR⁰⁰—, —CR⁰=CR⁰⁰₂, —CY¹=CY²—, and —C≡C—,
and
wherein one or more H atoms are optionally replaced by F; and
R⁰, R⁰⁰, Y¹, and Y² are defined as in claim 1.

6. The positive tone photoresist formulation according to claim 5, wherein the second siloxane monomer is represented by the following Structure S1:

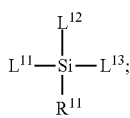

wherein:
$L^{11}$, $L^{12}$, and $L^{13}$ are the same or different from each other and each independently is selected from OR';
R' is selected from the group consisting of straight chain alkyl having 1 to 20 carbon atoms, branched-chain alkyl having 3 to 20 carbon atoms, cyclic alkyl having 3 to 20 carbon atoms, and aryl having 6 to 14 carbon atoms, wherein one or more non-adjacent and non-terminal $CH_2$ groups are optionally replaced by —O—, —S—, —C(=O)—, —C(=S)—, —C(=O)—O—, —O—C(=O)—, —NR⁰—, —SiR⁰R⁰⁰—, —CF₂—, —CR⁰=CR⁰⁰—, —CY¹=CY²— or —C≡C—, and wherein one or more H atoms are optionally replaced by F;
$R^{11}$ is selected from the group consisting of H, straight-chain alkyl having 1 to 20 carbon atoms, branched-chain alkyl having 3 to 20 carbon atoms, cyclic alkyl having 3 to 20 carbon atoms, and aryl having 6 to 14 carbon atoms, which optionally contain one or more functional groups selected from —O—, —S—, —C(=O)—, —C(=S)—, —C(=O)—O—, —O—C (=O)—, —NR⁰—, —SiR⁰R⁰⁰—, —CF₂—, —CR⁰=CR⁰⁰—, —CR⁰=CR⁰⁰₂, —CY¹=CY²—, and —C≡C—, and wherein one or more H atoms are optionally replaced by F.

7. The positive tone photoresist formulation according to claim 6, wherein
R¹ is selected from the group consisting of straight chain alkyl having 1 to 12 carbon atoms, branched-chain alkyl having 3 to 12 carbon atoms, cyclic alkyl having 3 to 12 carbon atoms, and aryl having 6 to 14 carbon atoms; and
$R^{11}$ is selected from the group consisting of —CH₃, —CF₃, —C₂H₅, —C₂F₅, —C₃H₇, —C₃F₇, —C₄H₉, —C₄F₉, —C₅H₁₁, —O₅H₄F₇, —C₆H₁₃, —C₆H₄F₉, —C₇H₁₅, —C₇H₄F₁₁, —C₈H₁₇, —C₈H₄F₁₃, —CH=CH₂, —C(CH₃)=CH₂, —C₃H₆—O—C(=O)—CH=CH₂, —C₃H₆—O—C(=O)—C(CH₃)=CH₂, —C₆H₅, and —C₆F₅.

8. The positive tone photoresist formulation according to claim 5, wherein the second siloxane monomer is represented by the following Structure S1:

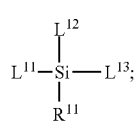

wherein:
$L^{11}$, $L^{12}$, and $L^{13}$ are the same or different from each other and each independently is selected from OR';
R' is selected from the group consisting of straight chain alkyl having 1 to 12 carbon atoms, branched-chain alkyl having 3 to 12, carbon atoms, cyclic alkyl having 3 to 12 carbon atoms, and aryl having 6 to 14 carbon atoms, wherein one or more non-adjacent and non-terminal $CH_2$ groups are optionally replaced by -O-, -S-, -C(=O)-, -C(=S)-, -C(=O)-O-, -O-C(=O)-, -NR⁰-, -SiR₀R₀₀-, -CF₂-, -CR⁰=CR⁰⁰, -CY¹=CY²- or -C≡C-, and wherein one or more H atoms are optionally replaced by F.
$R^{11}$ is selected from the group consisting of H, straight-chain alkyl having 1 to 12 carbon atoms, branched-chain alkyl having 3 to 12 carbon atoms, cyclic alkyl having 3 to 12 carbon atoms, and aryl having 6 to 14 carbon atoms, which optionally contain one or more functional groups selected from -O-, -S-, -C(=O)-, -C(=S)-, -C(=O)-O-, -O-C(=O)-, -NR⁰-, -SiR⁰R⁰⁰-, -CF₂-, -CR⁰=CR⁰⁰-, -CR⁰=CR⁰⁰₂, -CY¹=CY²- and -C≡C-, and wherein one or more H atoms are optionally replaced by F.

9. The positive tone photoresist formulation according to claim 1,
wherein the siloxane polymer further comprises a third repeating unit, wherein the third repeating unit does not contain a maleimide group.

10. The positive tone photoresist formulation according to claim 9,
wherein the third repeating unit is derived from a third siloxane monomer represented by one of the following Structures T1 or T2:

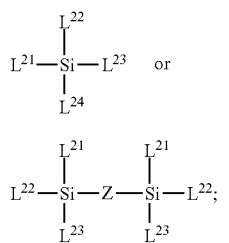

wherein:
L²¹, L²², L²³, and L²⁴ are the same or different from each other and each independently is selected from OR" and halogen;
R" is selected from the group consisting of straight-chain alkyl having 1 to 30 carbon atoms, branched-chain alkyl having 3 to 30 carbon atoms, cyclic alkyl having 3 to 30 carbon atoms, and aryl having 6 to 20 carbon atoms, wherein one or more non-adjacent and non-terminal CH₂ groups are optionally replaced by —O—, —S—, —C(=O)—, —C(=S)—, —C(=O)—O—, —O—C(=O)—, —NR⁰—, —SiR⁰R⁰⁰—, —CF₂—, —CR⁰=CR⁰⁰—, —CY¹=CY²— or and wherein one or more H atoms are optionally replaced by F;
Z is absent or denotes a straight-chain alkylene group having 1 to 20 carbon atoms, a branched-chain alkylene group having 3 to 20 carbon atoms or a cyclic alkylene group having 3 to 20 carbon atoms, in which one or more non-adjacent and non-terminal CH₂ groups are optionally replaced by —O—, —S—, —C(=O)—, —C(=S)—, —C(=O)—O—, —O—C(=O)—, —NR⁰—, —SiR⁰R⁰⁰—, —CF₂—, —CR⁰=CR⁰⁰—, —CY¹=CY²— or —C≡C—, and in which one or more H atoms are optionally replaced by F.

11. The positive tone photoresist formulation according to claim 10, wherein the third siloxane monomer is represented by the following Structure T1:

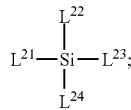

wherein:
L²¹, L²², L²³, and L²⁴ are the same or different from each other and each independently is selected from OR";
R" is selected from the group consisting of straight chain alkyl having 1 to 20 carbon atoms, branched-chain alkyl having 3 to 20 carbon atoms, cyclic alkyl having 3 to 20 carbon atoms, and aryl having 6 to 14 carbon atoms, wherein one or more non-adjacent and non-terminal CH₂ groups are optionally replaced by —O—, —S—, —C(=O)—, —C(=S)—, —C(=O)—O—, —O—C(=O)—, —NR⁰—, —SiR⁰R⁰⁰—, —CF₂—, —CR⁰=CR⁰⁰—, —CY¹=CY²— or —C≡C—, and wherein one or more H atoms are optionally replaced by F.

12. The positive tone photoresist formulation according to claim 10, wherein the third siloxane monomer is represented by the following Structure T2:

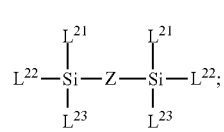

wherein
L²¹, L²², and L²³ are the same or different from each other and each independently is selected from OR";
R" is selected from the group consisting of straight chain alkyl having 1 to 20 carbon atoms, branched-chain alkyl having 3 to 20 carbon atoms, cyclic alkyl having 3 to 20 carbon atoms, and aryl having 6 to 14 carbon atoms, wherein one or more non-adjacent and non-terminal CH₂ groups are optionally replaced by —O—, —S—, —C(=O)—, —C(=S)—, —C(=O)—O—, —O—C(=O)—, —NR⁰—, —SiR⁰R⁰⁰—, —CF₂—, —CR⁰=CR⁰⁰—, —CY¹=CY²— or —C≡C—, and wherein one or more H atoms are optionally replaced by F;
Z is absent or denotes a straight-chain alkylene group having 1 to 12 carbon atoms, a branched-chain alkylene group having 3 to 12 carbon atoms or a cyclic alkylene group having 3 to 12 carbon atoms, in, which one or more non-adjacent and non-terminal CH₂ groups are optionally replaced by —O—, —S—, —C(=O)—, —C(=S)—, —C(=O)—O—, —O—C(=O)—, —NR⁰—, —SiR⁰R⁰⁰—, —CF₂—, —CR⁰=CR⁰⁰—, —CY¹=CY²— or —C≡C—, and in, which one or more H atoms are optionally replaced by F.

13. The positive tone photoresist formulation according to claim 10, wherein the third siloxane monomer is represented by the following Structure T1:

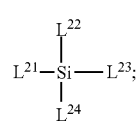

wherein:
L²¹, L²², L²³, and L²⁴ are the same or different from each other and each independently is selected from OR";
R" is selected from the group consisting of straight chain alkyl having 1 to 12 carbon atoms, branched-chain alkyl having 3 to 12 carbon atoms, cyclic alkyl having 3 to 12 carbon atoms, and aryl having 6 to 14 carbon atoms, wherein one or more non-adjacent and non-terminal CH2 groups are optionally replaced by -O-, -S-, -C(=O)-, -C(=S)-, -C(=O)-O-, -O-C(=O)-, -NR$^O$-, -SiR$_O$R$_{OO}$-, -CF$_2$-, -CR$^O$=CR$^{OO}$, -CY$^1$=CY$^2$- or -C≡C-, and wherein one or more H atoms are optionally replaced by F.

14. The positive tone photoresist formulation according to claim 10, wherein the third siloxane monomer is represented by the following Structure T2:

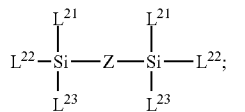

T2 wherein
L$^{21}$, L$^{22}$, and L$^{23}$ are the same or different from each other and each independently is selected from OR" ;
R" is selected from the group consisting of straight chain alkyl having 1 to 12 carbon atoms, branched-chain alkyl having 3 to 12 carbon atoms, cyclic alkyl having 3 to 12 carbon atoms, and aryl having 6 to 14 carbon atoms, wherein one or more non-adjacent and non-terminal CH$_2$ groups are optionally replaced by -O-, -S-, -C(=O)-, -C(=S)-, -C(=O)-O-, -O-C(=O)-, -NR$^O$-, -SiR$_O$R$_{OO}$-, -CF$_2$-, -CR$^O$=CR$^{OO}$, -CY$^1$=CY$^2$- or -C≡C-, and wherein one or more H atoms are optionally replaced by F;
Z is absent or denotes a straight-chain alkylene group having 1 to 12 carbon atoms, a branched-chain alkylene group having 3 to 12 carbon atoms or a cyclic alkylene group having 3 to 12 carbon atoms, in, which one or more non-adjacent and non-terminal CH$_2$ groups are optionally replaced by -O-, -S-, -C(=O)-, -C(=S)-, -C(=O)-O-, -O-C(=O)-, -NR$^O$-, -SiR$^O$R$^{OO}$-, -CF$_2$-, -CR$^O$=CR$^{OO}$-, -CY$^1$h=CY$^2$- and -C≡C-, and wherein one or more H atoms are optionally replaced by F.

15. The positive tone photoresist formulation according to claim 9,
wherein the mole fraction of the third repeating unit in the siloxane polymer is in the range from 0 to 50%, based on the total amount of repeating units in the siloxane polymer.

16. The positive tone photoresist formulation according to claim 1, wherein the siloxane polymer further comprises one or more further repeating unit, wherein the one or more further repeating unit does not contain a maleimide group, and is derived from one or more further siloxane monomer represented by the following Structure F1:

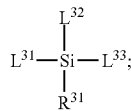

F1 wherein:
L$^{31}$, L$^{32}$, and L$^{33}$ are the same or different from each other and each independently is selected from OR''' and halogen;
R''' is selected from the group consisting of straight-chain alkyl having 1 to 30 carbon atoms, branched-chain alkyl having 3 to 30 carbon atoms, cyclic alkyl having 3 to 30 carbon atoms, and aryl having 6 to 20 carbon atoms, wherein one or more non-adjacent and non-terminal CH$_2$ groups are optionally replaced by —O—, —S—, —C(=O)—, —C(=S)—, —C(=O)—O—, —O—C(=O)—, —NR$^O$—, —SiR$^O$R$^{OO}$—, —CF$_2$—, —CR$^O$=CR$^{OO}$—, —CY$^1$=CY$^2$— or —C≡C—, and wherein one or more H atoms are optionally replaced by F;
R$^{31}$ is selected from the group consisting of H, straight-chain alkyl having 1 to 30 carbon atoms, branched-chain alkyl having 3 to 30 carbon atoms, cyclic alkyl having 3 to 30 carbon atoms, and aryl having 6 to 20 carbon atoms, which optionally contain one or more functional groups selected from —O—, —S—, —C(=O)—, —C(=S)—, —C(=O)—O—, —O—C(=O)—, —NR$^O$—, —SiR$^O$R$^{OO}$—, —CF$_2$—, —CR$^O$=CR$^{OO}$—, —CR$^O$=CR$^{OO}$$_2$—, —CY$^1$=CY$^2$—, and —C≡C—, and wherein one or more H atoms are optionally replaced by F; and
R$^O$, R$^{OO}$, Y$^1$ and Y$^2$ are defined as in claim 1.

17. The positive tone photoresist formulation according to claim 1,
wherein the mole fraction of the first repeating unit in the siloxane polymer is in the range from 1 to 90%, based on the total amount of repeating units in the siloxane polymer.

18. The positive tone photoresist formulation according to claim 1,
wherein the mole fraction of the second repeating unit in the siloxane polymer is in the range from 10 to 90%, based on the total amount of repeating units in the siloxane polymer.

19. The positive tone photoresist formulation according to claim 1, wherein the photoactive dissolution modulator is selected from diazonaphthoquinone (DNQ) or derivatives thereof.

20. The positive tone photoresist formulation according to claim 1,
comprising one or more further siloxane polymers, wherein the further siloxane polymers do not contain maleimide groups.

21. Method for manufacturing a microelectronic structure comprising the following steps:
(1) applying a positive tone photoresist formulation according to claim 1 to a surface of a substrate;
(2) photopatterning of the positive tone photoresist formulation applied in step (1) to obtain a photopatterned structure; and
(3) curing the photopatterned structure obtained in step (2) to obtain a cured photopatterned dielectric material on the surface of the substrate.

22. Electronic device comprising a microelectronic structure, obtainable by the method for manufacturing according to claim 21.

* * * * *